US012593730B2

(12) United States Patent
Kim

(10) Patent No.: US 12,593,730 B2
(45) Date of Patent: Mar. 31, 2026

(54) DISPLAY DEVICE INCLUDING PROTRUDING PORTION AND METHOD OF MANUFACTURING THE SAME

(71) Applicant: Samsung Display Co., LTD., Yongin-si (KR)

(72) Inventor: Jae Hoon Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 477 days.

(21) Appl. No.: 18/062,917

(22) Filed: Dec. 7, 2022

(65) Prior Publication Data

US 2023/0253374 A1    Aug. 10, 2023

(30) Foreign Application Priority Data

Feb. 4, 2022    (KR) ........................ 10-2022-0014581

(51) Int. Cl.
| | |
|---|---|
| *H10H 20/831* | (2025.01) |
| *H01L 25/075* | (2006.01) |
| *H10H 20/83* | (2025.01) |
| *H10H 20/857* | (2025.01) |
| *H10H 29/14* | (2025.01) |
| *H01L 25/16* | (2023.01) |

(52) U.S. Cl.
CPC ......... *H01L 25/0753* (2013.01); *H10H 20/83* (2025.01); *H10H 20/8312* (2025.01); *H01L 25/167* (2013.01); *H10H 20/857* (2025.01); *H10H 29/142* (2025.01)

(58) Field of Classification Search
CPC .............. H01L 25/0753; H01L 25/167; H10H 20/8312; H10H 20/857; H10H 29/142; H10H 20/83; H10K 2102/351; H10K 59/122; H10K 71/135; H10D 86/451

See application file for complete search history.

(56) References Cited

U.S. PATENT DOCUMENTS

| | | |
|---|---|---|
| 11,730,020 B2 | 8/2023 | Kim et al. |
| 11,957,003 B2 * | 4/2024 | Lee ...................... H10K 59/124 |
| 2021/0159268 A1 * | 5/2021 | Heo ...................... H10K 59/122 |
| 2022/0068901 A1 * | 3/2022 | Kong ...................... H10D 86/60 |
| 2022/0271021 A1 * | 8/2022 | Lee ...................... H10H 20/857 |
| 2023/0200176 A1 | 6/2023 | Lee et al. |

FOREIGN PATENT DOCUMENTS

| | | | |
|---|---|---|---|
| KR | 20210156909 A | 12/2021 | |
| KR | 2023-0094244 A | 6/2023 | |
| WO | WO-2020122337 A1 * | 6/2020 | ............. H10H 29/14 |

OTHER PUBLICATIONS

Machine Translation, WO 2020/122337 A1, Kong et al. (Year: 2020).*

* cited by examiner

*Primary Examiner* — Scott B Geyer
(74) *Attorney, Agent, or Firm* — Womble Bond Dickinson (US) LLP

(57) ABSTRACT

A display device includes a substrate; a via insulating layer on the substrate; and a first inner bank and a second inner bank on the via insulating layer and spaced from each other, wherein the via insulating layer includes a protruding portion located in a gap between the first inner bank and the second inner bank, and protruding from a top surface of the via insulating layer, and a thickness of the protruding portion is less than a thickness of the first inner bank and a thickness of the second inner bank.

17 Claims, 17 Drawing Sheets

1

VIA: PT1, PT2

NDA

DA

1

DR3

DR1

DR2

VIA: PT1, PT2

BP1_3: PT1_3
BP2_3: PT2_3

1

DISPLAY DEVICE INCLUDING PROTRUDING PORTION AND METHOD OF MANUFACTURING THE SAME

CROSS-REFERENCE TO RELATED APPLICATION

This application claims priority to and the benefit of Korean Patent Application No. 10-2022-0014581 filed on Feb. 4, 2022 in the Korean Intellectual Property Office, the entire content of which is incorporated by reference herein.

BACKGROUND

1. Field

The present disclosure relates to a display device and a method of manufacturing the same.

2. Description of the Related Art

Display devices have increasingly become of importance with the development of multimedia, and various types of display devices, such as an organic light-emitting diode (OLED) display device, a liquid crystal display (LCD) device, or the like, have been used.

A display device, which is a device for displaying an image, includes a display panel such as an OLED display panel or an LCD panel. The display panel may include light-emitting elements such as light-emitting diodes (LEDs), and the LEDs may be classified into OLEDs using an organic material as a fluorescent material and inorganic LEDs using an inorganic material as a fluorescent material.

Inorganic LEDs, which use an inorganic semiconductor as a fluorescent material, are durable even in a high-temperature environment and have a higher blue light efficiency than OLEDs.

SUMMARY

Aspects and features of embodiments of the present disclosure provide a display device capable of improving the lighting efficiency of pixels.

Aspects and features of embodiments of the present disclosure also provide a method of manufacturing a display device capable of improving the lighting efficiency of pixels.

However, aspects and features of embodiments of the present disclosure are not restricted to those set forth herein. The above and other aspects and features of embodiments of the present disclosure will become more apparent to one of ordinary skill in the art to which the present disclosure pertains by referencing the detailed description of the present disclosure given below.

According to one or more embodiments of the present disclosure, a display device includes a substrate; a via insulating layer on the substrate; and a first inner bank and a second inner bank on the via insulating layer and spaced apart from each other, wherein the via insulating layer includes a protruding portion located in a gap between the first inner bank and the second inner bank, and protruding from a top surface of the via insulating layer, and a thickness of the protruding portion is less than a thickness of the first inner bank and a thickness of the second inner bank.

In one or more embodiments, the protruding portion includes a first protrusion adjacent to the first inner bank, and a second protrusion adjacent to the second inner bank.

In one or more embodiments, a thickness of the first protrusion is less than the thickness of the first inner bank, and a thickness of the second protrusion is less than the thickness of the second inner bank.

In one or more embodiments, a height difference is formed between top surfaces of the first inner bank and the first protrusion, and a height difference is formed between top surfaces of the second inner bank and the second protrusion.

In one or more embodiments, the first protrusion and the second protrusion are spaced from each other.

In one or more embodiments, a display device may further include light-emitting elements in a gap between the first protrusion and the second protrusion.

In one or more embodiments, a display device may further include a first alignment electrode on the first protrusion; and a second alignment electrode on the second protrusion, wherein the first alignment electrode and the second alignment electrode are spaced from each other, and the light-emitting elements are in a gap between the first alignment electrode and the second alignment electrode.

According to one or more embodiments of the present disclosure a display device includes a substrate; a first inner bank and a second inner bank on the substrate and spaced from each other; and protrusions on the substrate, in a gap between the first inner bank and the second inner bank, wherein the protrusions include a first protrusion adjacent to the first inner bank, and a second protrusion adjacent to the second inner bank, a thickness of the first inner bank is greater than a thickness of the first protrusion, and a thickness of the second inner bank is greater than a thickness of the second protrusion.

In one or more embodiments, the protrusions include an insulating material.

In one or more embodiments, a height difference is formed between top surfaces of the first inner bank and the first protrusion, and a height difference is formed between top surfaces of the second inner bank and the second protrusion.

In one or more embodiments, the first protrusion and the second protrusion are spaced from each other.

In one or more embodiments, a display device may further include light-emitting elements in a gap between the first protrusion and the second protrusion.

In one or more embodiments, the protrusions include a conductive material.

In one or more embodiments, a display device may further include a first alignment electrode extending from both sides of the first protrusion and located on a top surface of the first inner bank and in the gap between the first and second inner banks; and a second alignment electrode extending from both sides of the second protrusion and located on a top surface of the second inner bank and in the gap between the first and second inner banks.

In one or more embodiments, a height difference is formed between top surfaces of the first inner bank and the first protrusion, and a height difference is formed between top surfaces of the second inner bank and the second protrusion.

In one or more embodiments, the first protrusion and the second protrusion are spaced from each other.

In one or more embodiments, a display device may further include light-emitting elements in a gap between the first and second protrusions.

According to one or more embodiments of the present disclosure, a display device includes a substrate; a first inner bank and a second inner bank on the substrate and spaced from each other; and a first outer bank and a second outer bank on the substrate and spaced from each other, wherein the first inner bank and the second inner bank are in a gap between the first outer bank and the second outer bank, the first inner bank includes a first part and a first protrusion protruding from a side of the first part toward the second inner bank, the second inner bank includes a second part and a second protrusion protruding from a side of the second part toward the first inner bank, a thickness of the first part is greater than a thickness of the first protrusion, and a thickness of the second part is greater than a thickness of the second protrusion.

In one or more embodiments, the first protrusion and second protrusion are spaced from each other, and the display device further includes light-emitting elements in a gap between the first protrusion and the second protrusion.

In one or more embodiments, a height difference is formed between top surfaces of the first inner bank and the first protrusion, and a height difference is formed between top surfaces of the second inner bank and the second protrusion.

According to the aforementioned and other embodiments of the disclosure, the lighting efficiency of pixels can be improved.

Also, a display device capable of improving the lighting efficiency of pixels can be provided.

It should be noted that the effects of the disclosure are not limited to those described above, and other effects of the disclosure will be apparent from the following description.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Embodiments of the present disclosure will hereinafter be described with reference to the accompanying drawings.

Figure 1:
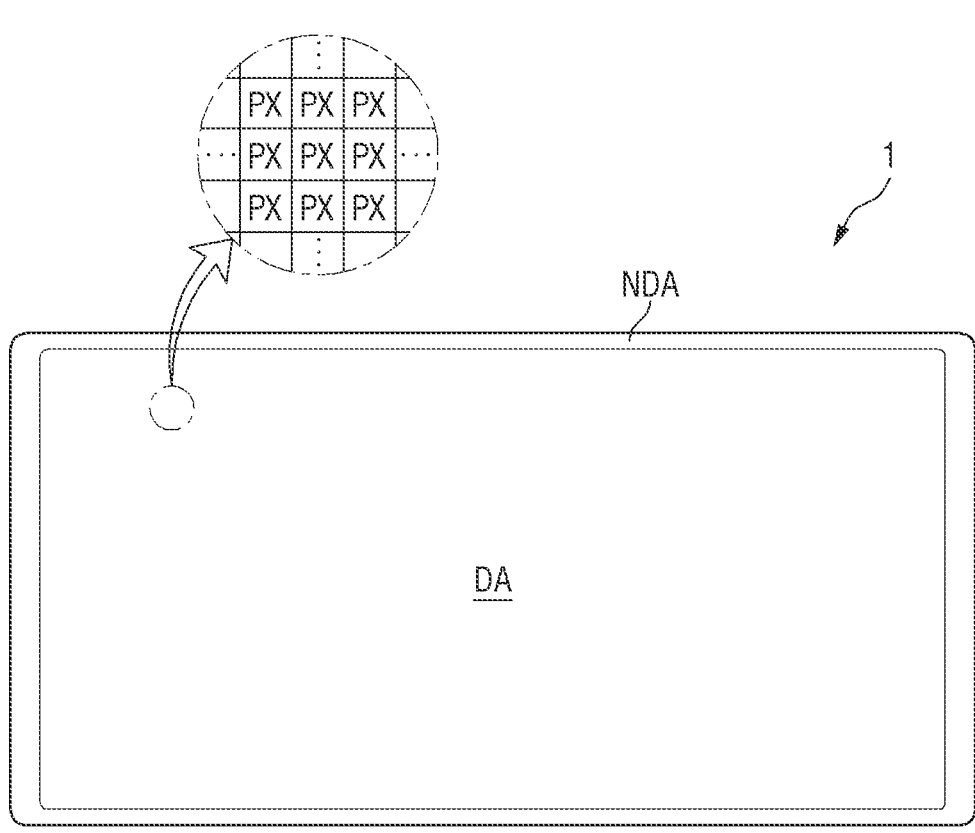
FIG. 1 is a plan view of a display device according to one or more embodiments of the present disclosure.
Figure 1:
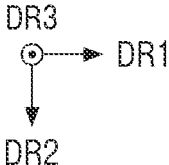

FIG. 1 is a plan view of a display device according to one or more embodiments of the present disclosure.

First, second, and third directions DR1, DR2, and DR3 are defined as illustrated in FIG. 1. The first and second directions DR1 and DR2 may be orthogonal to each other, and the second and third directions DR2 and DR3 may be orthogonal to each other. The first direction DR1 may be a horizontal direction, the second direction DR2 may be a vertical direction, and the third direction DR3 may be a top-to-down direction. Unless otherwise specified, a particular direction may refer to both sides in the particular direction. If there is the need to distinguish one side from the other side in the particular direction, one side in the particular direction may be referred to as a first side, and the other side in the particular direction may be referred to as a second side. Referring to FIG. 1, a direction indicated by an arrow may be referred to as a first side, and the opposite direction thereof may be referred to as a second side.

Referring to FIG. 1, a display device 1 displays a moving or still image. The display device 1 may refer to nearly all types of electronic devices that provide a display screen. Examples of the display device 1 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 1 includes a display panel that provides a display screen. Examples of the display panel of the display device 1 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 1 will hereinafter be described as being, for example, an ILED display panel, but the present disclosure is not limited thereto. That is, various other display panels are also applicable to the display panel of the display device 1.

The shape of the display device 1 may vary. In one example, the display device 1 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DA of the display device 1 may be similar to the shape of the display device 1. FIG. 1 illustrates that the display device 1 and the display area DA both have a rectangular shape that extends in a second direction DR2.

The display device 1 may include the display area DA and a non-display area NDA around (e.g., surrounding) an edge or periphery of the display area DA. The display area DA may be an area in which an image is displayed, and the non-display area NDA may be an area in which no image is displayed. The display area DA may also be referred to as an active area, and the non-display area NDA may also be referred to as an inactive area. The display area DA may occupy the middle (e.g., central) part of the display device 1.

The display area DA may include a plurality of pixels PX. The pixels PX may be arranged in row and column directions. For example, the pixels PX may be arranged along rows and columns of a matrix. Each of the pixels PX may have a rectangular or square shape in a plan view, but the present disclosure is not limited thereto. Alternatively, each of the pixels PX may have a rhombus shape having sides inclined with respect to a particular direction. The pixels PX may be arranged in a stripe fashion or an island fashion. Each of the pixels PX may include one or more light-emitting elements (see "ED" of FIG. 3), which emit light of a particular wavelength range. In one or more embodiments, the pixels PX may include pixels PX for emitting light of a first color, pixels PX for emitting light of a second color, and pixels PX for emitting light of a third color, the pixels PX for emitting light of the first color may include light-emitting elements ED for emitting light of the first color, the pixels PX for emitting light of the second color may include light-emitting elements ED for emitting light of the second color, and the pixels PX for emitting light of the third color may include light-emitting elements ED for emitting light of the third color. However, the present disclosure is not limited to this. Here, the first, second, and third colors may be blue, green, and red, respectively. The light-emitting elements ED will be described later in detail.

The non-display area NDA may be disposed around the display area DA. The non-display area NDA may surround the entire display area DA or a part of the display area DA. The display area DA may have a rectangular shape, and the non-display area NDA may be disposed adjacent to four sides of the display area DA. The non-display area NDA may form the bezel of the display device 1. Lines or circuit drivers included in the display device 1 may be disposed in the non-display area NDA, or external devices may be mounted in the non-display area NDA.

Figure 2:
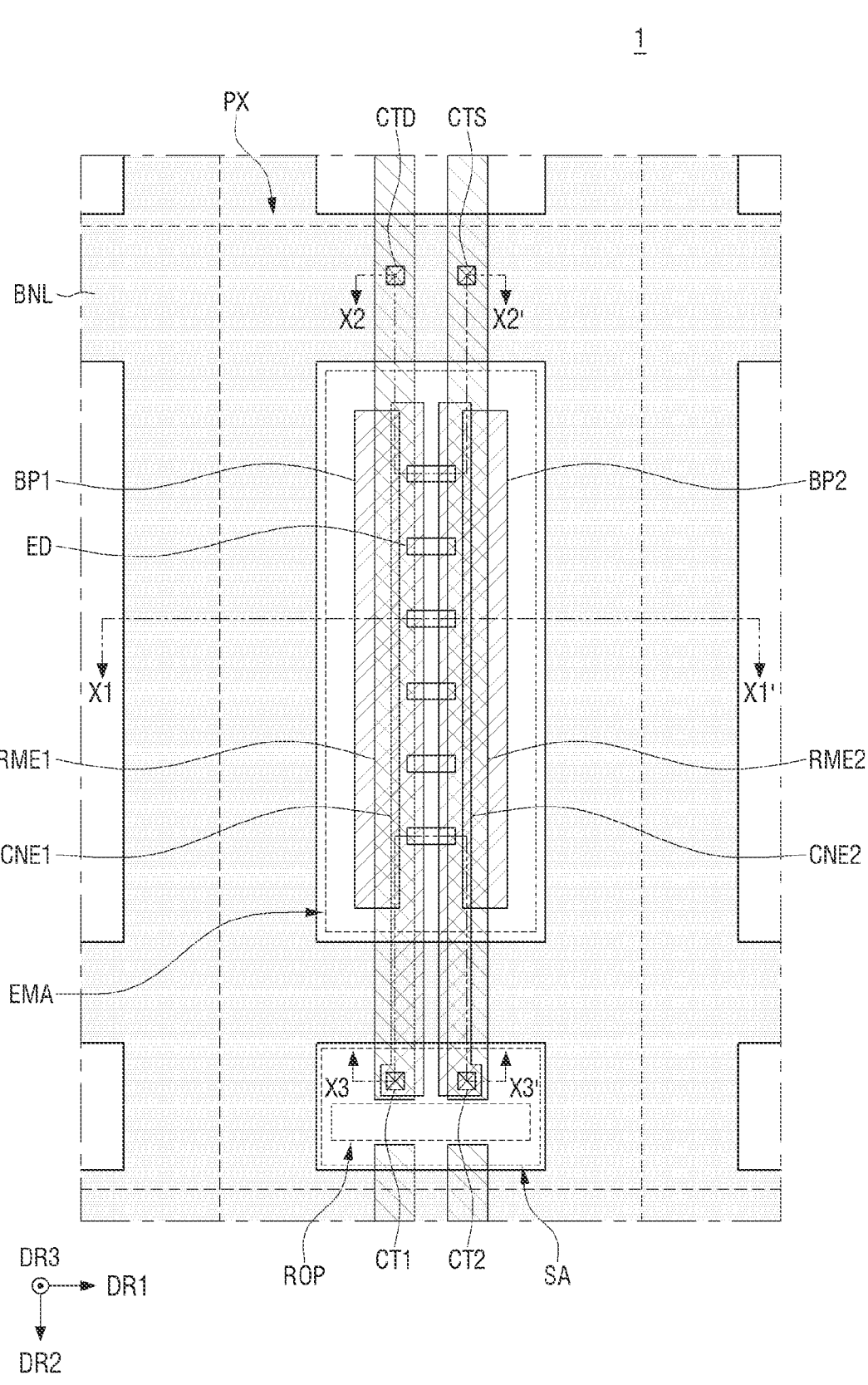
FIG. 2 is a layout view of pixels of the display device of FIG. 1.

FIG. 2 is a layout view of pixels of the display device of FIG. 1. FIG. 2 illustrates the layout of alignment electrodes RME (RME1, RME2), inner banks (BP1 and BP2), an outer bank (BNL), light-emitting elements ED, and connecting electrodes CNE (CNE1, CNE2) in each pixel PX of the display device 1.

Referring to FIG. 2, each pixel PX may include an emission area EMA and a non-emission area. The emission area EMA may be an area that emits light of a particular wavelength range due to the presence of light-emitting elements ED therein. The non-emission area may be an area that is not reached by light emitted by the light-emitting elements ED and does not output light due to the absence of light-emitting elements therein.

The emission area EMA may include a region where an array of light-emitting elements ED is disposed and a region around the array of light-emitting elements ED that outputs light emitted by the array of light-emitting elements ED. For example, the emission area EMA may also include a region that outputs light emitted by the array of light-emitting elements ED and then reflected or refracted by other members. A plurality of light-emitting elements ED may be disposed in each pixel PX to form an emission area EMA including a region where the light-emitting elements ED are disposed and the surroundings of the region where the light-emitting elements ED are disposed.

Each pixel PX may further include a subarea SA, which is disposed in the non-emission area. The subarea SA may be disposed on a first side, in the second direction DR2, of the emission area EMA. Emission areas EMA and subareas SA may be alternately arranged along the second direction DR2, and the subareas SA may be disposed between emission areas EMA of pixels PX that are spaced from one another in the second direction DR2. In one or more embodiments, emission areas EMA and subareas SA may be alternately arranged along the second direction DR2, and the emission areas EMA or the subareas may be repeatedly arranged along the first direction DR1. However, the present disclosure is not limited to this.

As light-emitting elements ED are not disposed in the subarea SA of each pixel PX, the subarea SA may not emit light, and alignment electrodes RME (RME1, RME2) may be disposed in part in the subarea SA. Sets of alignment electrodes RME (RME1, RME2) of two different pixels PX may be disposed to be spaced from one another in a separation part ROP of a subarea SA of one of the two different pixels PX.

Each pixel PX may include the alignment electrodes RME (RME1, RME2), the inner banks (BP1 and BP2), the outer bank BNL, the light-emitting elements ED, and the connecting electrodes CNE (CNE1, CNE2).

The inner banks (BP1 and BP2) may be disposed in the emission area EMA of each pixel PX. The inner banks (BP1 and BP2) may have a suitable width (e.g., a predetermined width) in the first direction DR1 and extend in the second direction DR2.

For example, the inner banks (BP1 and BP2) may include first and second inner banks BP1 and BP2, which are spaced from each other in the first direction DR1, in the emission area EMA. The first inner bank BP1 may be disposed on a second side, in the first direction DR1, of the center of the emission area EMA, and the second inner bank BP2 may be disposed on a first side, in the first direction DR1, of the center of the emission area EMA. The first and second inner banks BP1 and BP2 may be alternately arranged along the first direction DR1 in the form of island patterns, in the display area DA. A plurality of light-emitting elements ED may be disposed in the gap between the first and second inner banks BP1 and BP2.

The width, in the first direction DR1, of the first inner bank BP1 and the width, in the first direction DR1, of the second inner bank BP2 may be the same, but the present disclosure is not limited thereto. The width, in the second direction DR2, of the first inner bank BP1 and the width, in the second direction DR2, of the second inner bank BP2 may be the same and may be less than the width, in the second direction DR2, of the emission area EMA, surrounded by the outer bank BNL. In one or more embodiments, the first and second inner banks BP1 and BP2 may be spaced from parts of the outer bank BNL extending in the first direction DR1, but the present disclosure is not limited thereto.

The alignment electrodes RME (RME1, RME2) may be disposed in each pixel PX, extending in one direction. The alignment electrodes RME (RME1, RME2) may extend in the second direction DR2 to be disposed in the emission area EMA and the subarea SA and may be spaced from each other in the first direction DR1. The alignment electrodes RME (RME1, RME2) may be electrically connected to the light-emitting elements ED.

The alignment electrodes RME (RME1, RME2) may include first and second alignment electrodes RME1 and RME2. The first alignment electrode RME1 may be disposed on the second side, in the first direction DR1, of the center of the emission area EMA, and the second alignment electrode RME2 may be disposed on the first side, in the first direction DR1, of the center of the emission area EMA. The first alignment electrode RME1 may be disposed on the first inner bank BP1, and the second alignment electrode RME2 may be disposed on the second inner bank BP2. The first and second alignment electrodes RME1 and RME2 may extend beyond the outer bank BNL to be disposed in part not only in the emission area EMA, but also in the subarea SA. Pairs of first and second alignment electrodes RME1 and RME2 of two different pixels PX may be spaced from one another in a separation part ROP of a subarea SA of one of the two different pixels PX.

FIG. 2 illustrates that two alignment electrodes RME (RME1, RME2) are disposed in each pixel PX, extending in the second direction DR2, but the present disclosure is not limited thereto. That is, more than two alignment electrodes RME (RME1, RME2) may be disposed in one pixel PX and may be partially bent and have different widths from one location to another location.

The outer bank BNL may be disposed to surround each pixel PX or the emission area EMA and the subarea SA of each pixel PX. The outer bank BNL may be disposed along the boundaries of each of pixels PX that are adjacent to one another in the first and second directions DR1 and DR2, and along the boundaries between emission areas EMA and subareas SA of the corresponding pixels PX. The distances between the emission areas EMA of a plurality of pixels PX and between emission areas EMA and subareas SA of the plurality of pixels PX may vary depending on the width of the outer bank BNL.

The outer bank BNL may include parts extending in the first direction DR1 and parts extending in the second direction DR2, in a plan view, and may be arranged in a lattice shape over the entire surface of the display area DA. Pixels PX, emission areas EMA, and subareas SA may be areas that are defined by the layout of the bank layer. In other words, the outer bank BNL may be disposed along the boundaries of each pixel PX to define each pair of adjacent pixels PX and may also be disposed to surround, and thereby define, an emission area EMA and a subarea SA in each pixel PX.

A plurality of light-emitting elements ED may be disposed in the emission area EMA of each pixel PX. In other words, the light-emitting elements ED may be disposed in the gap between the first and second inner banks BP1 and BP2. The light-emitting elements ED may be spaced t from one another in the second direction DR2. For example, the light-emitting elements ED may extend in one direction, and both end portions of each of the light-emitting elements ED may be disposed on different alignment electrodes RME. The width, in the first direction DR1, of the light-emitting elements ED may be greater than the width, in the first direction DR1, of the gap between the first and second alignment electrodes RME1 and RME2. The light-emitting elements ED may be arranged vertically with respect to the direction in which the alignment electrodes RME (RME1, RME2) extend, i.e., with respect to the second direction DR2, but the present disclosure is not limited thereto. Alternatively, the light-emitting elements ED may be disposed to extend in the first direction DR1 or a direction inclined from the first direction DR1. The structure of the light-emitting elements ED will be described later with reference to FIG. 3.

The connecting electrodes CNE may be disposed on the alignment electrodes RME (RME1, RME2) and the inner banks (BP1 and BP2). The connecting electrodes CNE (CNE1, CNE2) may extend in one direction and may be spaced from each other. The connecting electrodes CNE (CNE1, CNE2) may be in contact with the light-emitting elements ED and may be electrically connected to the alignment electrodes RME (RME1, RME2) or a circuit layer (see "CCL" of FIG. 5) therebelow.

The connecting electrodes CNE may include first and second connecting electrodes CNE1 and CNE2, which are disposed in each pixel PX.

The first connecting electrode CNE1 may extend in the second direction DR2 and may be disposed on the first alignment electrode RME1 or the first inner bank BP1. The first connecting electrode CNE1 may partially overlap with the first alignment electrode RME1 and may extend beyond the outer bank BNL to be disposed not only in the emission area EMA, but also in the subarea SA.

The second connecting electrode CNE2 may extend in the second direction DR2 and may be disposed on the second alignment electrode RME2 or the second inner bank BP2. The second connecting electrode CNE2 may partially overlap with the second alignment electrode RME2 and may extend beyond the outer bank BNL to be disposed not only in the emission area EMA, but also in the subarea SA.

The structure of the light-emitting elements ED will hereinafter be described.

Figure 3:
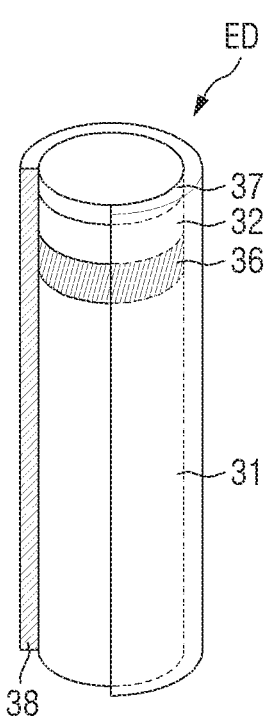
FIG. 3 is a perspective cutaway view of a light-emitting element of FIG. 2.

FIG. 3 is a perspective cutaway view of a light-emitting element according to one or more embodiments of the present disclosure.

Referring to FIG. 3, a light-emitting element ED may be a light-emitting diode (LED), particularly, an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may have a shape that extends in one direction. In one or more embodiments, the light-emitting element ED may have the shape of a cylinder, a rod, a wire, or a tube, but the shape of the light-emitting element ED is not particularly limited.

The light-emitting element ED may include semiconductor layers doped with a dopant of an arbitrary conductivity type (e.g., a p type or an n type). The semiconductor layers may receive electric signals from an external power source to emit light of a particular wavelength range. The light-emitting element ED may include a first semiconductor layer 31, a second semiconductor layer 32, the light-emitting layer 36, an electrode layer 37, and the insulating film 38.

The first semiconductor layer 31 of the light-emitting element ED may include an n-type semiconductor. The first semiconductor layer 31 may include a semiconductor material, i.e., $Al_xGa_yIn_{1-x-y}N$ (where $0 \le x \le 1$, $0 \le y \le 1$, and $0 \le x+y \le 1$). In one example, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 of the light-emitting element ED may be disposed on the first semiconductor layer 31 with the light-emitting layer 36 interposed therebetween. The second semiconductor layer 32 may include a p-type semiconductor. The second semiconductor layer 32 may include a semiconductor material, i.e., $Al_xGa_yIn_{1-x-y}N$ (where $0 \le y \le 1$, $0 \le y \le 1$, and $0 \le x+y \le 1$). In one example, the second semiconductor layer 32 may include at least one of AlGaInN, GaN, AlGaN, InGaN, AlN, and InN that are doped with a p-type dopant. The p-type dopant may be Mg, Zn, Ca, Se, or Ba.

FIG. 3 illustrates that the first and second semiconductor layers 31 and 32 are formed as single layers, but the present disclosure is not limited thereto. Alternatively, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 of the light-emitting element ED may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electric signals applied thereto via the first and second semiconductor layers 31 and 32. The light-emitting layer 36 may include a material such as AlGaN or AlGaInN. In particular, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN.

The light-emitting layer 36 may have a structure in which a semiconductor material having a large band gap energy and a semiconductor material having a small band gap energy are alternately stacked or may include Group-III or Group-V semiconductor materials depending on the wavelength of light to be emitted. The type of light emitted by the light-emitting layer 36 is not particularly limited. Alternatively, the light-emitting layer 36 may emit light of a red or green wavelength range, instead of blue light.

The electrode layer 37 of the light-emitting element ED may be an ohmic connecting electrode CNE, but the present disclosure is not limited thereto. Alternatively, the electrode layer 37 may be a Schottky connecting electrode CNE. The light-emitting element ED may include at least one electrode layer 37. The light-emitting element ED may include more than one electrode layer 37, but the present disclosure is not limited thereto. Alternatively, the electrode layer 37 may not be provided.

The electrode layer 37 may reduce the resistance between the light-emitting element ED and electrodes or connecting electrodes CNE when the light-emitting element ED is electrically connected to the electrodes or the connecting electrodes CNE. The electrode layer 37 may include a conductive metal. In one example, the electrode layer 37 may include at least one of Al, Ti, In, Au, Ag, ITO, IZO, and ITZO. The electrode layer 37 may be provided at one end of the light emitting element ED, for example, on the second semiconductor layer 32 or the first semiconductor layer 31. The electrode layer 37 may be provided at one end of the light emitting element ED. For example, the electrode layer 37 may be provided at one on the second semiconductor layer 32 that is not adjacent to the light-emitting layer 36.

The insulating film 38 of the light-emitting element ED may protect the first and second semiconductor layers 31 and 32 and the electrode layer 37. The insulating film 38 can prevent any short circuit that may occur in the light-emitting element 36 in case that the light-emitting element ED is in direct contact with electrodes to which electric signals are applied. Also, the insulating film 38 can prevent the degradation of the emission efficiency of the light-emitting element ED.

The insulating film 38 may be disposed to be around (e.g., surround) the first and second semiconductor layers 31 and 32 and the electrode layer 37. In one example, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). The insulating film 38 is illustrated as being a single-layer film, but the present disclosure is not limited thereto. Alternatively, in one or more embodiments, the insulating film 38 may be formed as a multilayer film in which multiple layers are stacked.

The structure of the display device 1 will hereinafter be described.

Figure 4:
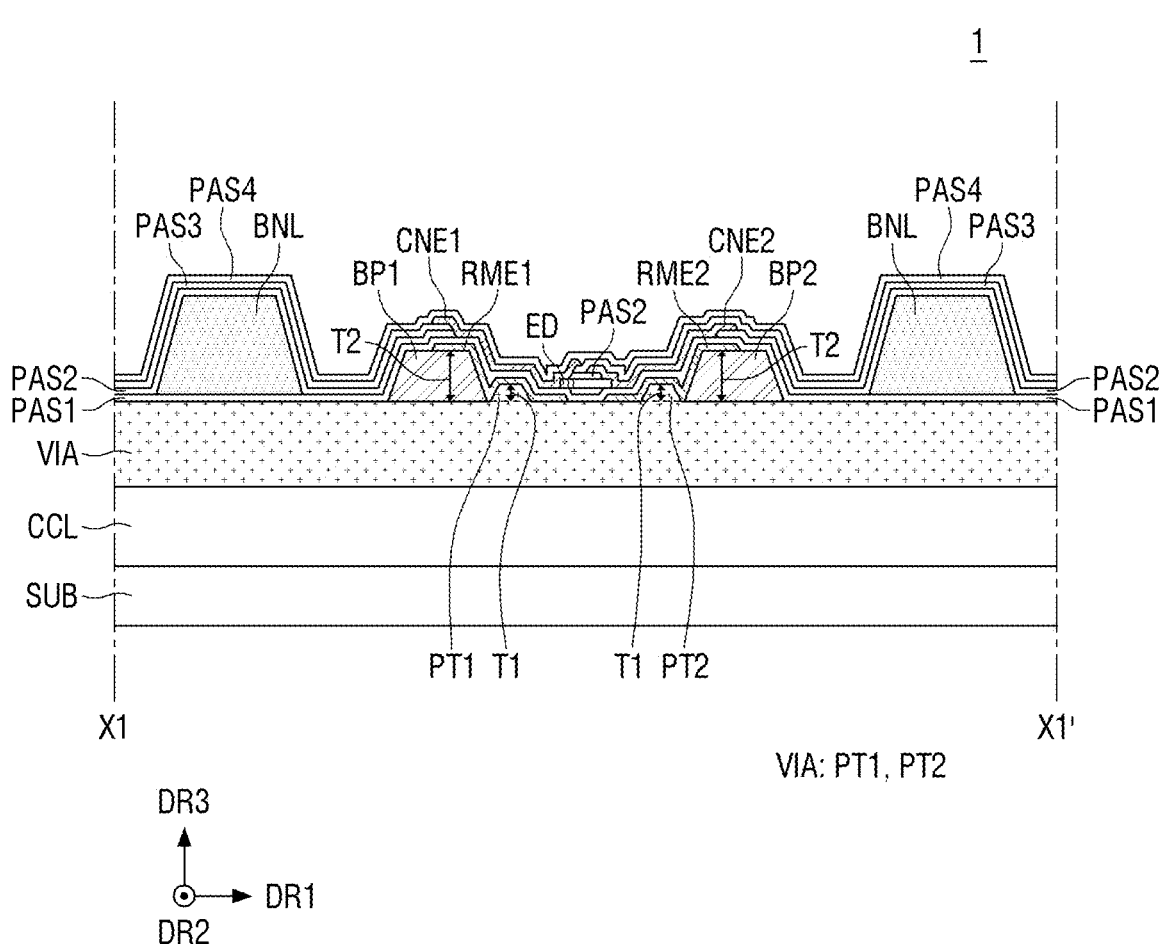
FIG. 4 is a cross-sectional view taken along the line X1-X1' of FIG. 2.
Figure 5:
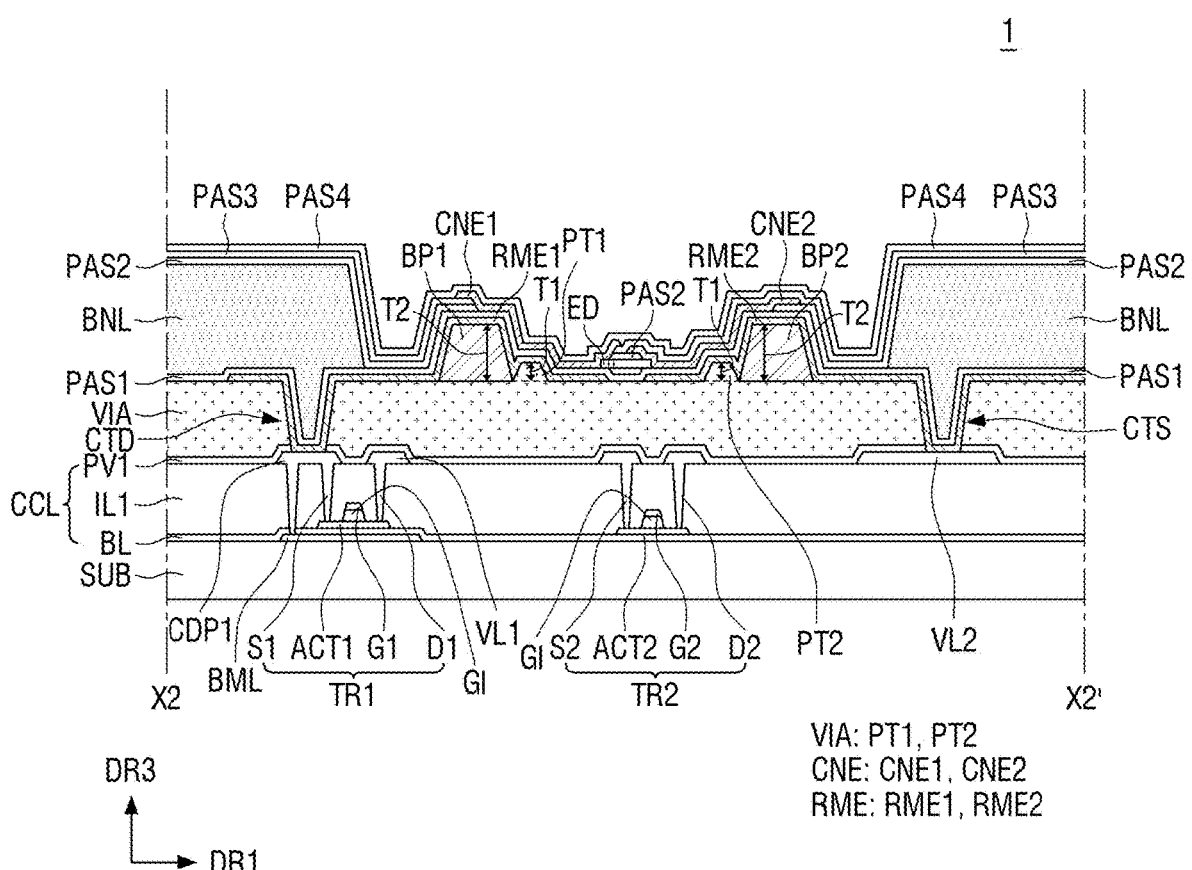
FIG. 5 is a cross-sectional view taken along the line X2-X2' of FIG. 2.
Figure 6:
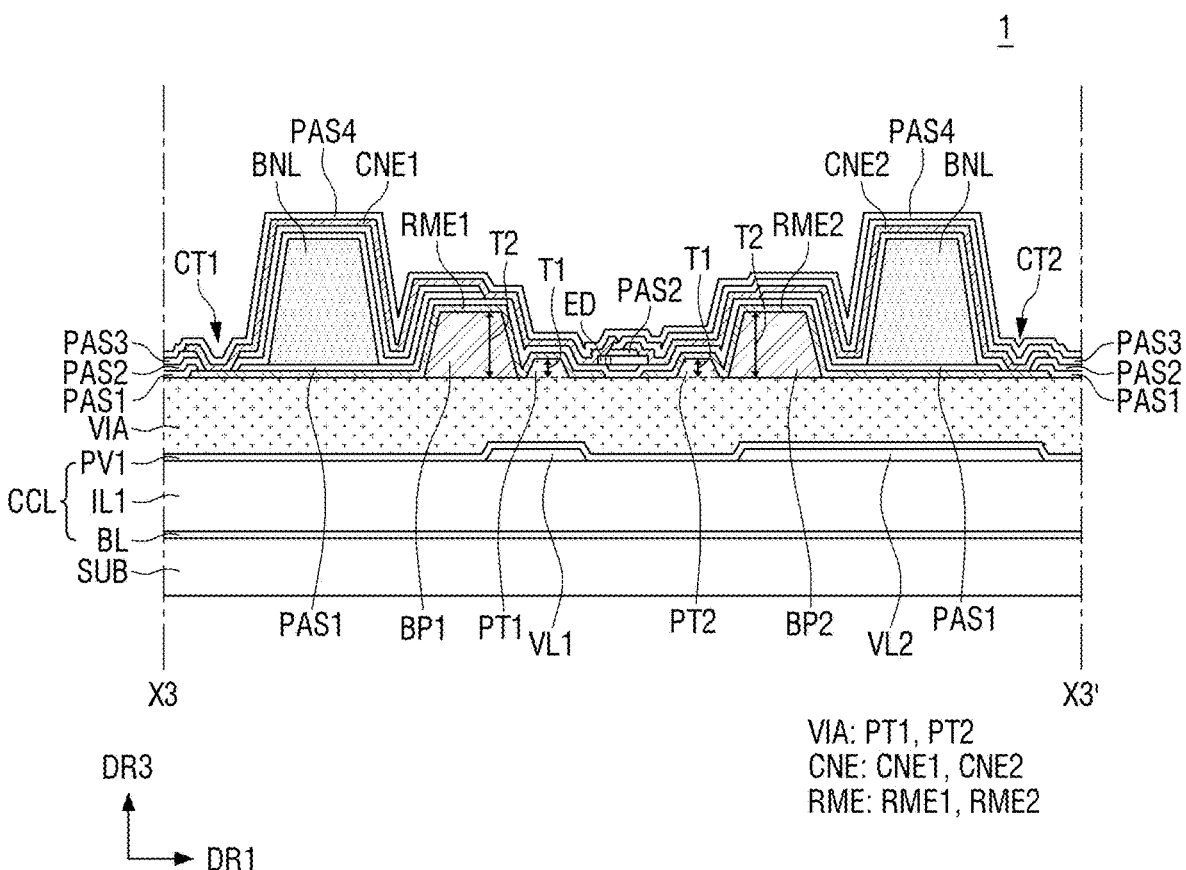
FIG. 6 is a cross-sectional view taken along the line X3-X3' of FIG. 2.

FIG. 4 is a cross-sectional view taken along the line X1-X1' of FIG. 2. FIG. 5 is a cross-sectional view taken along the line X2-X2' of FIG. 2. FIG. 6 is a cross-sectional view taken along the line X3-X3' of FIG. 2.

Referring to FIGS. 4 through 6, the display device 1 may include a substrate SUB and a semiconductor layer, a plurality of conductive layers, and a plurality of insulating layers, which are disposed on the substrate SUB. The display device 1 may also include the alignment electrodes RME (RME1, RME2), the light-emitting elements ED, and the connecting electrodes CNE (CNE1, CNE2). The semiconductor layer, the conductive layers, and the insulating layers may form the circuit layer CCL.

The substrate SUB may be formed of an insulating material such as glass, quartz, or a polymer resin. The substrate SUB may be a rigid substrate or may be a flexible substrate that is bendable, foldable, or rollable.

The circuit layer CCL may be disposed on the substrate SUB. Lines transmitting electrical signals to the light-emitting elements ED on the substrate SUB may be disposed in the circuit layer CCL. The circuit layer CCL may include a plurality of conductive layers, i.e., a first conductive layer, a semiconductor layer, a second conductive layer, and a third conductive layer, as illustrated in FIGS. 5 and 6. The circuit layer CCL may also include a plurality of insulating layers, i.e., a buffer layer BL, a first gate insulating layer GI, a first interlayer insulating layer IL1, and a first passivation layer PV1.

The first conductive layer may be disposed on the substrate SUB. The first conductive layer may include a lower metal layer BML, and the lower metal layer BML may be disposed to overlap with a first active layer ACT1 of a first transistor TR1 in the third direction DR3. The lower metal layer BML may prevent light from being incident upon the first active layer ACT1 of the first transistor TR1 or may be electrically connected to the first active layer ACT1 to stabilize the electrical characteristics of the first transistor TR1. In one or more embodiments, the lower metal layer BML may not be provided.

The buffer layer BL may be disposed on the lower metal layer BML and the substrate SUB. The buffer layer BL may be formed on the substrate SUB to protect transistors of each pixel PX from moisture that may infiltrate into each pixel PX through the substrate SUB, which is susceptible to moisture, and may perform a surface planarization function.

The semiconductor layer is disposed on the buffer layer BL. The semiconductor layer may include the first active layer ACT1 of the first transistor TR1 and a second active layer ACT2 of a second transistor TR2. The first and second active layers ACT1 and ACT2 may be disposed to partially overlap with first and second gate electrodes G1 and G2, respectively, of the second conductive layer in the third direction DR3.

The semiconductor layer may include polycrystalline silicon, monocrystalline silicon, or an oxide semiconductor. Alternatively, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Each pixel PX is illustrated as including the first and second transistors TR1 and TR2, but the present disclosure is not limited thereto. Alternatively, each pixel PX may include more than two transistors.

The first gate insulating layer GI is disposed on the semiconductor layer, in the display area DA. The first gate insulating layer GI may function as a gate insulating film for each of the first and second transistors TR1 and TR2. The first gate insulating layer GI is illustrated as being patterned together with the first and second gate electrodes G1 and G2 of the second conductive layer to be disposed in part between the second conductive layer and the first and second active layers ACT1 and ACT2 of the semiconductor layer, but the present disclosure is not limited thereto. In one or more embodiments, the first gate insulating layer GI may be disposed on the entire surface of the buffer layer BL.

The second conductive layer is disposed on the first gate insulating layer GI. The second conductive layer may include the first and second gate electrodes G1 and G2 of the first and second transistors TR1 and TR2. The first gate electrode G1 may be disposed to overlap with a channel region of the first active layer ACT1 in the third direction DR3, which is a thickness direction of the substrate SUB, and the second gate electrode G2 may be disposed to overlap with a channel region of the second active layer ACT2 in the third direction DR3.

The first interlayer insulating layer IL1 is disposed on the second conductive layer. The first interlayer insulating layer IL1 may function as an insulating film between the second conductive layer and layers disposed on the second conductive layer and may protect the second conductive layer.

The third conductive layer is disposed on the first interlayer insulating layer IL1. The third conductive layer may include first and second voltage lines VL1 and VL2, a first conductive pattern CDP1, and first and second source electrodes S1 and S2 and first and second drain electrodes D1 and D2 of the first and second transistors TR1 and TR2, which are disposed in the display area DA.

A high-potential voltage (or a first power supply voltage), which is to be delivered to the first alignment electrode RME1, may be applied to the first voltage line VL1, and a low-potential voltage (or a second power supply voltage), which is to be delivered to the second alignment electrode RME2, may be applied to the second voltage line VL2. Part of the first voltage line VL1 may be in contact with the first active layer ACT1 of the first transistor TR1 through a contact hole penetrating the first interlayer insulating layer IL1. The first voltage line VL1 may function as the first drain electrode D1 of the first transistor TR1. The second voltage line VL2 may be directly connected to the second alignment electrode RME2.

The first conductive pattern CDP1 may be in contact with the first active layer ACT1 of the first transistor TR1 through a contact hole penetrating the first interlayer insulating layer IL1. The first conductive pattern CDP1 may be in contact with the lower metal layer BML through a contact hole penetrating the first interlayer insulating layer IL1 and the buffer layer BL. The first conductive pattern CDP1 may function as the first source electrode S1 of the first transistor TR1. The first conductive pattern CDP1 may be connected to the first alignment electrode RME1 or the first connecting electrode CNE1. The first transistor TR1 may transmit the first power supply voltage from the first voltage line VL1 to the first alignment electrode RME1 or the first connecting electrode CNE1.

The second source and drain electrodes S2 and D2 may be in contact with the second active layer ACT2 of the second transistor TR2 through contact holes penetrating the first interlayer insulating layer IL1.

The first passivation layer PV1 is disposed on the third conductive layer and the first interlayer insulating layer IL1. The first passivation layer PV1 may function as an insulating film between the third conductive layer and other layers disposed thereon and may protect the third conductive layer.

Each of the buffer layer BL, the first gate insulating layer GI, the first interlayer insulating layer IL1, and the first passivation layer PV1 may include a plurality of inorganic layers that are alternately stacked. For example, each of the buffer layer BL, the first gate insulating layer GI, the first interlayer insulating layer IL1, and the first passivation layer PV1 may be formed as a double-layer film or a multilayer film including at least one of $SiO_x$, $SiN_x$, and $SiO_xN_y$.

A via insulating layer VIA may be disposed on the circuit layer CCL. For example, the via insulating layer VIA may be disposed on the first passivation layer PV1 of the circuit layer CCL. The via insulating layer VIA may include an organic insulating material such as polyimide and may thus be able to compensate for any height differences formed by lines or wires in the circuit layer CCL and thus to form a flat top surface.

The via insulating layer VIA may include protrusions (PT1 and PT2), which are disposed in the gap between the first and second inner banks BP1 and BP2 to protrude from the top surface of the via insulating layer VIA toward a first side, in the third direction DR3, of the display device 1. The protrusions (PT1 and PT2), which are parts of the via insulating layer VIA, and may be integrally formed with the via insulating layer VIA. In other words, the via insulating layer VIA and the inner banks (BP1 and BP2) may be in direct contact with one another.

The protrusions may include first and second protrusions PT1 and PT2. The first protrusion PT1 may be adjacent to the first inner bank BP1, and the second protrusion PT2 may be adjacent to the second inner bank BP2. The first and second protrusions PT1 and PT2 may be spaced from each other in the first direction DR1.

The thickness of the first protrusion PT1, i.e., a first thickness T1, may be less than the thickness of the first inner bank BP1, i.e., a second thickness T2. Accordingly, a height difference may be formed between the top surfaces of the first inner bank BP1 and the first protrusion PT1. Similarly, the thickness of the second protrusion PT2, i.e., the first thickness T1, may be less than the thickness of the second inner bank BP2, i.e., the second thickness T2. Accordingly, a height difference may be formed between the top surfaces of the second inner bank BP2 and the second protrusion PT2. In one or more embodiments, the protrusions (PT1 and PT2) may have a trapezoidal shape in a cross-sectional view, but the present disclosure is not limited thereto.

The protrusions (PT1 and PT2) can prevent light-emitting elements ED dispersed in ink (see "INK" of FIGS. 8 and 9), ejected into the gap between the first and second inner banks BP1 and BP2, from flowing toward the edges of the ink and can thus reduce the edge thickness of the ink, thereby improving the lighting efficiency of each pixel PX. This will be described later in detail.

The inner banks (BP1 and BP2) may be disposed on the via insulating layer VIA. For example, the inner banks (BP1 and BP2) may be disposed directly on the via insulating layer VIA and may at least partially protrude from the top surface of the via insulating layer VIA. Each of protruding parts of the inner banks (BP1 and BP2) may have inclined sides or curved sides with a suitable curvature (e.g., a predetermined curvature), and light emitted from the light-emitting elements ED may be reflected by the alignment electrodes RME (RME1, RME2) on the inner banks (BP1 and BP2) and may thus be emitted out of the first side, in the third direction DR3, of the display device 1. The inner banks (BP1 and BP2) may include an organic insulating material such as polyimide, but the present disclosure is not limited thereto.

The alignment electrodes RME (RME1, RME2) may be disposed on the inner banks (BP1 and BP2), the protrusions (PT1 and PT2), and the via insulating layer VIA. The first alignment electrode RME1 may extend in a direction toward the second inner bank BP2, i.e., in a direction toward a first side, in the first direction DR1, of the display device 1, and the second alignment electrode RME2 may extend in a direction toward the first inner bank BP1, i.e., in a direction toward a second side, in the first direction DR1, of the display device 1. The first alignment electrode RME1 may be disposed at least on the inclined sides of the first inner bank BP1, the top surface and the inclined sides of the first protrusion PT1, and part of the top surface of the via insulating layer VIA between the first and second protrusions PT1 and PT2, and the second alignment electrode RME2 may be disposed at least on the inclined sides of the second inner bank BP2, the top surface and the inclined sides of the second protrusion PT2, and part of the top surface of the via insulating layer VIA between the first and second protrusions PT1 and PT2.

The distance, in the first direction DR1, between the first and second alignment electrodes RME1 and RME2 may be less than the distance, in the first direction DR1, between the first and second inner banks BP1 and BP2. At least parts of the first and second alignment electrodes RME1 and RME2 may be disposed directly on the via insulating layer VIA to be placed at the same plane.

The light-emitting elements ED, which are disposed between the first and second alignment banks BP1 and BP2, may emit light through both end portions thereof, and the emitted light may travel toward the alignment electrodes RME (RME1, RME2) on the inner banks (BP1 and BP2). Thus, light emitted from the light-emitting elements ED may be reflected by the alignment electrodes RME (RME1, RME2) and may thus be output in the third direction DR3.

Referring to FIG. 5, the alignment electrodes RME (RME1, RME2) may be in direct contact with the third conductive layer through first and second electrode contact holes CTD and CTS, in areas that overlap with the outer bank BNL. The first electrode contact hole CTD may be formed in an area where the outer bank BNL and the first alignment electrode RME1 overlap with each other, and the second electrode contact hole CTS may be formed in an area where the outer bank BNL and the second alignment electrode RME2 overlap with each other. The first alignment electrode RME1 may be in contact with the first conductive pattern CDP1 through the first electrode contact hole CTD, which penetrates the via insulating layer VIA and the first passivation layer PV1. The second alignment electrode RME2 may be in contact with the second voltage line VL2 through the second electrode contact hole CTS, which penetrates the via insulating layer VIA and the first passivation layer PV1. The first alignment electrode RME1 may be electrically connected to the first transistor TR1 through the first conductive pattern CDP1 and may thus receive the first power supply voltage, and the second alignment electrode RME2 may be electrically connected to the second voltage line VL2 and may thus receive the second power supply voltage.

The alignment electrodes RME (RME1, RME2) may include a conductive material with high reflectance. For example, the alignment electrodes RME (RME1, RME2) may include a metal such as silver (Ag), copper (Cu), or aluminum (Al), an alloy of Al, Ni, or lanthanum (La), or a stack of a layer of titanium (Ti), molybdenum (Mo), or niobium (Nb) and an alloy of Al, Ni, or La. In one or more embodiments, the alignment electrodes RME (RME1, RME2) may be formed as double-layer films or multilayer films in which an alloy of Al and at least one layer of Ti, Mo, or Nb are stacked.

However, the present disclosure is not limited to this. In another example, the alignment electrodes RME (RME1, RME2) may include a material such as ITO, IZO, or IZTO. In one or more embodiments, the alignment electrodes RME (RME1, RME2) may be formed as stacks of at least one layer of a transparent conductive material and at least one layer of a metal with high reflectance or may be formed as single layers including the transparent conductive material and the metal with high reflectance. For example, the alignment electrodes RME (RME1, RME2) may have a stack of ITO/Ag/ITO/, ITO/Ag/IZO, or ITO/Ag/ITZO/IZO. The alignment electrodes RME (RME1, RME2) may be electrically connected to the light-emitting elements ED and may reflect some of light emitted from the light-emitting elements ED, in an upward direction from the substrate SUB.

A first insulating layer PAS1 may be disposed on the entire surface of the display area DA and may be arranged on the via insulating layer VIA and the alignment electrodes RME (RME1, RME2). The first insulating layer PAS1 may include an insulating material and may thus protect the alignment electrodes RME (RME1, RME2) and insulate the alignment electrodes RME (RME1, RME2) from each other. As the first insulating layer PAS1 is disposed to cover the alignment electrodes RME (RME1, RME2) before the formation of the outer bank BNL, the first insulating layer PAS1 can prevent the alignment electrodes RME (RME1, RME2) from being damaged during the formation of the outer bank BNL. Also, the first insulating layer PAS1 can prevent the light-emitting elements ED from being in direct contact with, and damaged by, other members.

For example, the first insulating layer PAS1 may be recessed in part between the alignment electrodes RME (RME1, RME2), which are spaced from each other in the first direction DR1, to form a height difference on the top surface thereof. The light-emitting elements ED may be disposed on part of the top surface of the first insulating layer PAS1 where a height difference is formed, and space may be formed between the first insulating layer PAS1 and the light-emitting elements ED.

Referring to FIG. 6, the first insulating layer PAS1 may include first and second contacts CT1 and CT2. The first and second contacts CT1 and CT2 may be disposed to overlap with different alignment electrodes RME (RME1, RME2). For example, the first contact CT1 may be disposed to overlap with the first alignment electrode RME1, and the second contact CT2 may be disposed to overlap with the second alignment electrode RME2. The first and second contacts CT1 and CT2 may penetrate the first insulating layer PAS1 to expose parts of the top surfaces of the first and second alignment electrodes RME1 and RME2. The first and second contacts CT1 and CT2 may further penetrate other insulating layers disposed on the first insulating layer PAS1. The first and second alignment electrodes RME1 and RME2, which are exposed by the first and second contacts CT1 and CT2, may be in contact with the connecting electrodes CNE (CNE1, CNE2).

The outer bank BNL may be disposed on the first insulating layer PAS1. The outer bank BNL may include parts extending in the first direction DR1 and parts extending in the second direction DR2 and may surround each pixel PX. The outer bank BNL may surround each pixel PX to separate pixels PX from one another and may surround the boundaries of the display area DA of each pixel PX to define and separate the display area DA and the non-display area NDA of each pixel PX. For convenience, part of the outer bank BNL on a second side, in the first direction DR1, of the emission area EMA may be referred to as a first outer bank BNL, and part of the outer bank BNL on a first side, in the first direction DR1, of the emission area EMA may be referred to as a second outer bank BNL.

The light-emitting elements ED may be in contact with the connecting electrodes CNE (CNE1, CNE2) and may thus be electrically connected to the alignment electrodes RME (RME1, RME2) and the circuit layer CCL below the via insulating layer VIA. The light-emitting elements ED may emit light of a particular wavelength range in response to electrical signals being applied thereto.

The outer bank BNL, like the inner banks (BP1 and BP2), may have a suitable light (e.g., a predetermined height). In one or more embodiments, the top surface of the outer bank BNL may be higher than the top surfaces of the inner banks (BP1 and BP2), and the thickness of the outer bank BNL may be greater than or the same as the thickness of the inner banks (BP1 and BP2). The outer bank BNL may prevent ink from spilling over between neighboring pixels PX in an inkjet printing process during the fabrication of the display device 1. The outer bank BNL, like the inner banks (BP1 and BP2), may include an organic insulating material such as polyimide.

A second insulating layer PAS2 may be disposed on the light-emitting elements ED, the first insulating layer PAS1, and the outer bank BNL. The second insulating layer PAS2 may include pattern parts, which extend in the first direction DR1 between the inner banks (BP1 and BP2) and are disposed on the light-emitting elements ED. The pattern parts may be disposed to surround parts of the outer surfaces of each of the light-emitting elements ED, but may not cover both sides or both ends of each of the light-emitting elements ED. The pattern parts may form linear or island patterns in the pixel PX, in a plan view. The pattern parts of the second insulating layer PAS2 may protect and fix the light-emitting elements ED during the fabrication of the display device 1. Also, the second insulating layer PAS2 may be disposed to fill the space between the first insulating layer PAS1 and the light-emitting elements ED. Parts of the second insulating layer PAS2 may be disposed on the outer bank BNL.

Referring to FIG. 6, the second insulating layer PAS2 may include the first and second contacts CT1 and CT2. The first contact CT1 is disposed to overlap with the first alignment electrode RME1, and the second contact CT2 is disposed to overlap with the second alignment electrode RME2. The first and second contacts CT1 and CT2 may penetrate not only the first insulating layer PAS1, but also the second insulating layer PAS2. The first and second contacts CT1 and CT2 may expose parts of the first and second alignment electrodes RME1 and RME2.

The connecting electrodes CNE (CNE1, CNE2) may be disposed on the alignment electrodes RME (RME1, RME2) and the inner banks (BP1 and BP2). The first connecting electrode CNE1 may be disposed on the first alignment electrode RME1 and the first inner bank BP1. The first connecting electrode CNE1 may partially overlap with the first alignment electrode RME1 and may extend from the emission area EMA beyond the outer bank BNL. The second connecting electrode CNE2 may be disposed on the second alignment electrode RME2 and the second inner bank BP2. The second connecting electrode CNE2 may partially overlap with the second alignment electrode RME2 and may extend from the emission area EMA beyond the outer bank BNL.

The first and second connecting electrodes CNE1 and CNE2 may be disposed on the second insulating layer PAS2 and may be in contact with the light-emitting elements ED. The first connecting electrode CNE1 may partially overlap with the first alignment electrode RME1 and may be in contact with first end portions of the light-emitting elements ED. The second connecting electrode CNE2 may partially overlap with the second alignment electrode RME2 and may be in contact with second end portions of the light-emitting elements ED. The connecting electrodes CNE may be in contact with the light-emitting elements ED and may be electrically connected to the third conductive layer. The first connecting electrode CNE1 may be in contact with the first end portions of the light-emitting elements ED, and the second connecting electrode CNE2 may be in contact with the second end portions of the light-emitting elements ED.

The connecting electrodes CNE (CNE1, CNE2) may be in contact with the alignment electrodes RME (RME1, RME2) through the first and second contacts CT1 and CT2. The first connecting electrode CNE1 may be in contact with the first alignment electrode RME1 through the first contact CT1, which penetrates the first insulating layer PAS1, the second insulating layer PAS2, and a third insulating layer PAS3. The second connecting electrode CNE2 may be in contact with the second alignment electrode RME2 through the second contact CT2, which penetrates the first and second insulating layers PAS1 and PAS2. The connecting electrodes CNE (CNE1, CNE2) may be electrically connected to the third conductive layer through the alignment electrodes RME. The first connecting electrode CNE1 may be electrically connected to the first transistor TR1 and may thus receive the first power supply voltage, and the second connecting electrode CNE2 may be electrically connected to the second voltage line VL2 and may thus receive the second power supply voltage. The connecting electrodes CNE may be in contact with the light-emitting elements ED, in the emission area EMA, to transmit power supply voltages to the light-emitting elements ED.

The connecting electrodes CNE (CNE1, CNE2) may include a conductive material. For example, the connecting electrodes CNE (CNE1, CNE2) may include ITO, IZO, IZTO, or Al. For example, the connecting electrodes CNE (CNE1, CNE2) may include a transparent conductive material, and light emitted by the light-emitting elements ED may be output through the connecting electrodes CNE.

The third insulating layer PAS3 is disposed on the second connecting electrode CNE2 and the second insulating layer PAS2. The third insulating layer PAS3 may be disposed on the entire surface of the second insulating layer PAS2 to cover the second connecting electrode CNE2, and the first connecting electrode CNE1 may be disposed on the third insulating layer PAS3. The third insulating layer PAS3 may insulate the first and second connecting electrodes CNE1 and CNE2 and may thus prevent the first and second connecting electrodes CNE1 and CNE2 from being in direct contact with each other.

The third insulating layer PAS3 may include the first contact CT1. The first contact CT1 may penetrate not only the first and second insulating layers PAS1 and PAS2, but also the third insulating layer PAS3. The first contact CT1 may expose part of the first alignment electrode RME1 therebelow.

A fourth insulating layer PAS4 may be disposed on the third insulating layer PAS3, the connecting electrodes CNE (CNE1, CNE2), and the outer bank BNL. The fourth insulating layer PAS4 may protect the layers disposed on the substrate SUB. In one or more embodiments, the fourth insulating layer PAS4 may not be provided.

The first, second, third, and fourth insulating layers PAS1, PAS2, PAS3, and PAS4 may include an inorganic insulating material or an organic insulating material. For example, the first, second, third, and fourth insulating layers PAS1, PAS2, PAS3, and PAS4 may include one of $SiO_x$, $SiN_x$, and $SiO_xN_y$. The first, second, third, and fourth insulating layers PAS1, PAS2, PAS3, and PAS4 may all include the same material, only some of the first, second, third, and fourth insulating layers PAS1, PAS2, PAS3, and PAS4 may include the same material, or the first, second, third, and fourth insulating layers PAS1, PAS2, PAS3, and PAS4 may all include different materials.

A color control structure and color filters may be further disposed on the fourth insulating layer PAS4, and detailed descriptions thereof will be omitted.

A method of manufacturing the display device 1 will hereinafter be described.

FIGS. 7 through 10 are cross-sectional views illustrating a method of manufacturing the display device of FIG. 1. FIG. 11 is a cross-sectional view of a display device 1' according to a comparative example. The display device 1' of FIG. 11 differs from the display device 1 in that protrusions are not formed on the top surface of a via insulating layer VIA.

Referring to FIGS. 7 through 10, the method of manufacturing the display device of FIG. 1 may include forming a via insulating layer VIA, which includes first and second protrusions PT1 and PT2, first and second inner banks BP1 and BP2, alignment electrodes RME, a first insulating layer PAS1, and an outer bank BNL; ejecting ink having light-emitting elements ED dispersed therein into the gap between the first and second inner banks BP1 and BP2; and aligning the light-emitting elements ED by applying a current to the alignment electrodes RME (RME1, RME2) to form an electric field.

Figure 7:
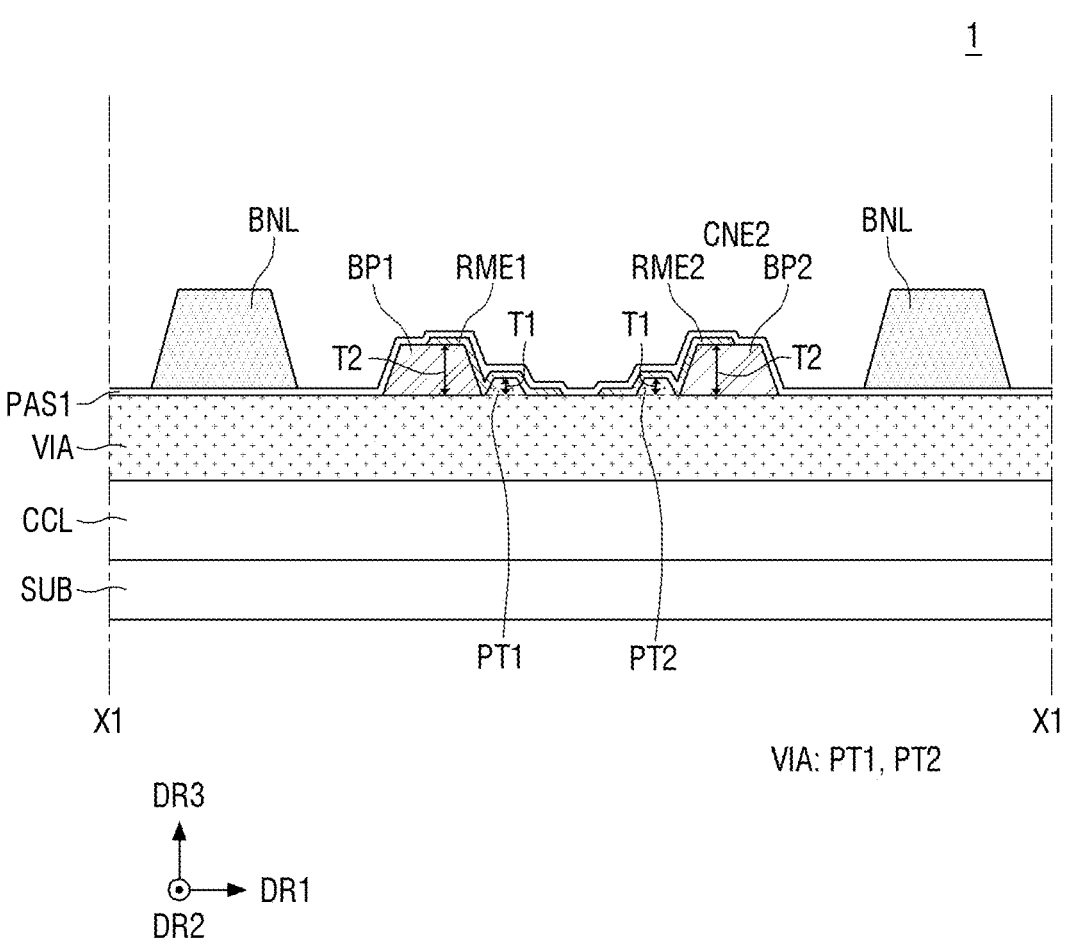
FIGS. 7 through 10 are cross-sectional views illustrating a method of manufacturing the display device of FIG. 1.

For example, referring to FIG. 7, the via insulating layer VIA, the first and second inner banks BP1 and BP2, the alignment electrodes RME, the first insulating layer PAS1, and the outer bank BNL are formed. For example, the via insulating layer VIA, which includes the first and second protrusions PT1 and PT2, may be formed by an etching process using a mask.

The first and second protrusions PT1 and PT2 may be formed by forming the via insulating layer VIA and etching the entire insulating layer except for parts to be formed into the first and second protrusions PT1 and PT2, using an etching stopper. Thereafter, the first and second banks BP1 and BP2, the alignment electrodes RME, the first insulating layer PAS1, and the outer bank BNL are formed. A detailed description of how to form the first and second banks BP1 and BP2, the alignment electrodes RME, the first insulating layer PAS1, and the outer bank BNL will be omitted.

Figure 8:
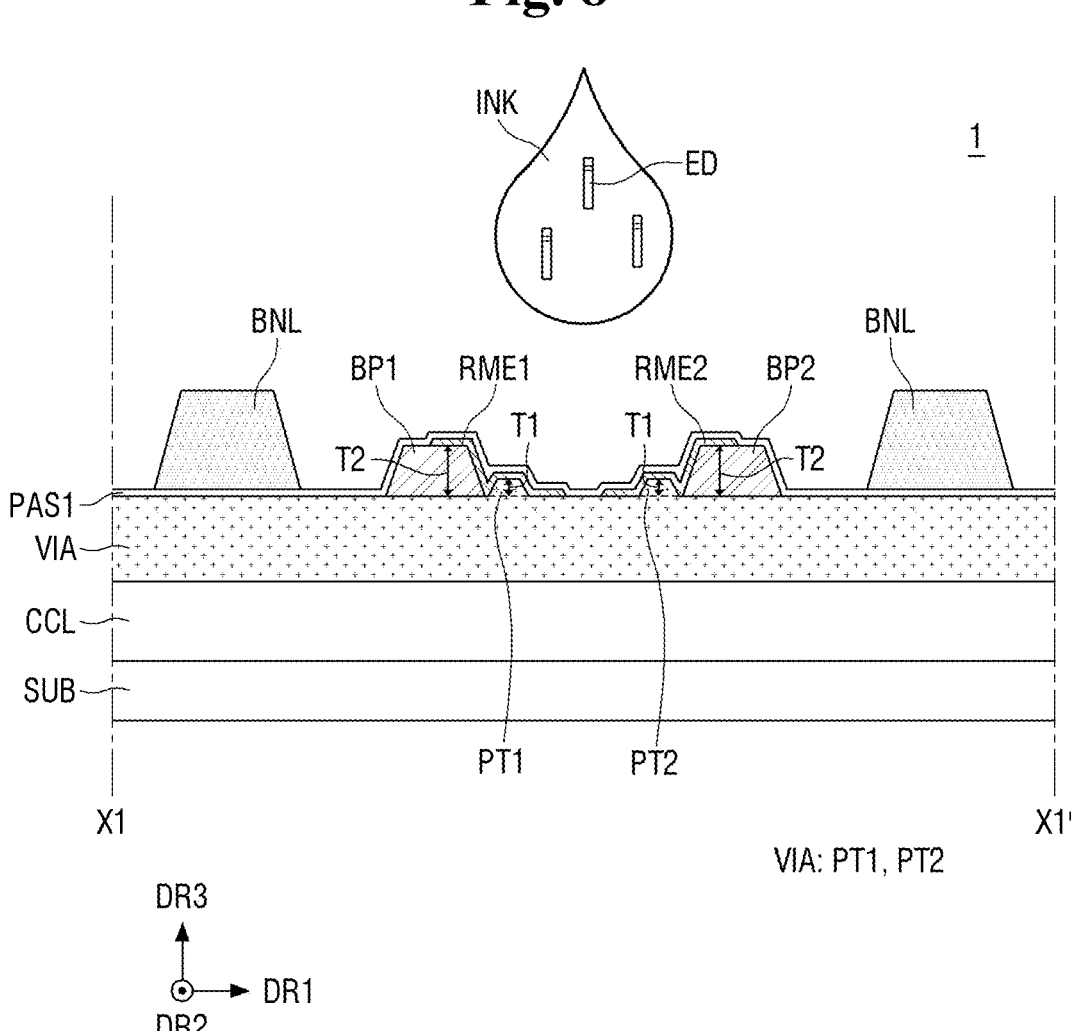
Figure 9:
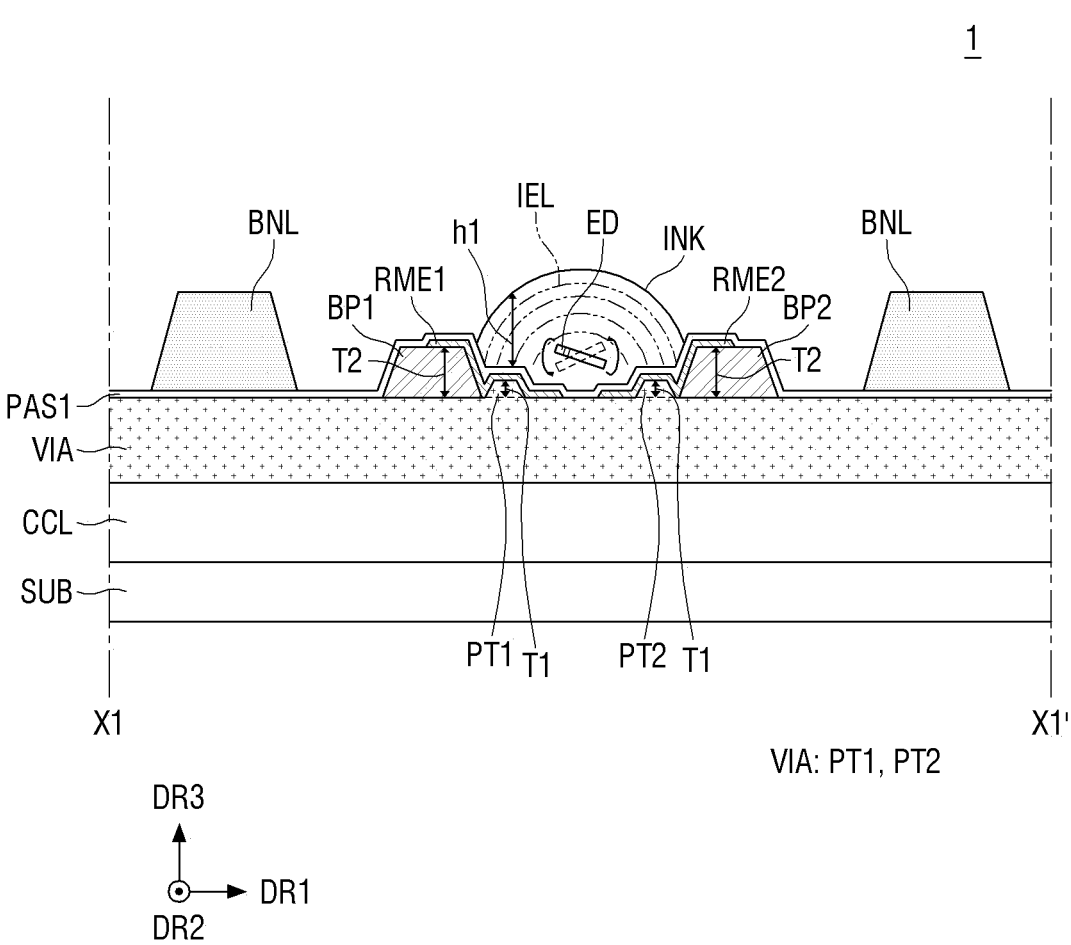

Thereafter, referring to FIGS. 8 and 9, ink "INK" having the light-emitting elements ED dispersed therein is ejected into the gap between the first and second inner banks BP1 and BP2, and an electric field IEL is formed in the ejected ink "INK" by applying electrical signals to the first and second alignment electrodes RME1 and RME2. For example, the ejection of the ink "INK" may be performed using an inkjet printing device.

As electrical signals are applied to the first and second alignment electrodes RME1 and RME2, the electric field IEL is formed in the ink "INK" having the light-emitting elements ED dispersed therein, and due to a dielectrophoretic force from the electric field IEL, the light-emitting elements ED may be safely seated in the gap between the first and second alignment electrodes RME1 and RME2, changing their alignment directions and locations.

Due to its surface tension, the ink "INK" ejected into the gap between the first and second inner banks BP1 and BP2 may form a curved surface that is convex in the third direction DR3 and ranges from the first inner bank BP1 to the second inner bank BP2. As a result, the thickness of the ink "INK" ejected into the gap between the first and second inner banks BP1 and BP2 may vary along the first direction DR1. However, referring to FIG. 11, if the edge thickness of the ink "INK", i.e., a thickness h1' of the ink "INK" near the first or second inner bank BP1 or BP2, is too large, the light-emitting elements ED in the ink "INK" may tend to move toward the edges of the ink "INK". If the light-emitting elements ED fail to be seated in the gap between the first and second alignment electrodes RME1 and RME2 and are instead placed close to the first or second inner bank BP1 or BP2, the light-emitting elements ED may fail to be in proper contact with connecting electrodes CNE (CNE1, CNE2) and may thus not be able to emit light because of not being able to receive electrical signals through the connecting electrodes CNE (CNE1, CNE2). As a result, the lighting efficiency of each pixel PX may deteriorate. Therefore, the light-emitting elements ED need to be guided into the gap between the first and second alignment electrodes RME1 and RME2, rather than being placed near the first or second inner bank BP1 or BP2.

As a thickness h1 of the ink "INK" near the first or second inner bank BP1 or BP2 is relatively small, as compared to the display device 1' of FIG. 11, due to the presence of the first and second protrusions PT1 and PT2, which protrude from the top surface of the via insulating layer VIA in the third direction DR3, the tendency of the light-emitting elements ED to move toward the edges of the ink "INK" can be reduced. As a result, the light-emitting elements ED can be prevented from being placed near the first or second inner bank BP1 or BP2 and can be properly guided into the gap between the first and second alignment electrodes RME1 and RME2. Thus, as the light-emitting elements ED can be in proper contact with the connecting electrodes CNE, the lighting efficiency of each pixel PX can be improved.

Figure 10:
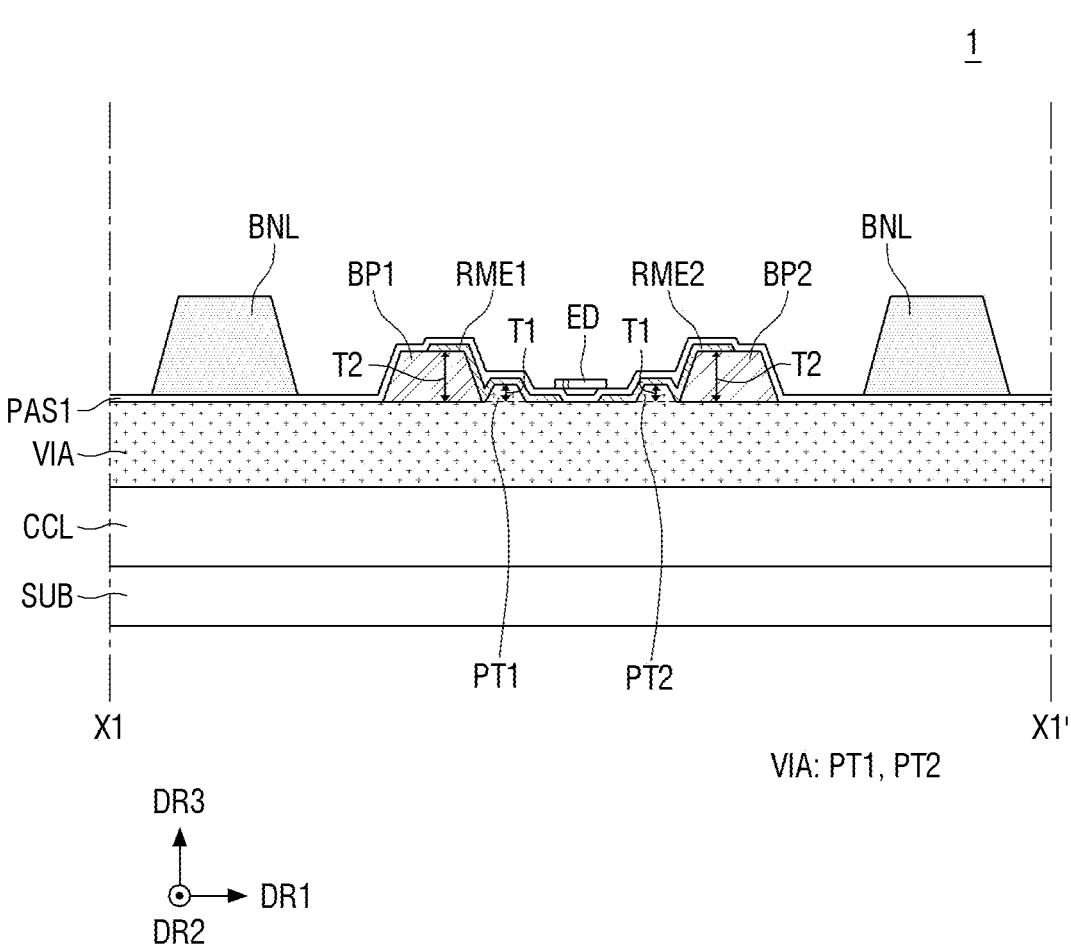
Figure 11:
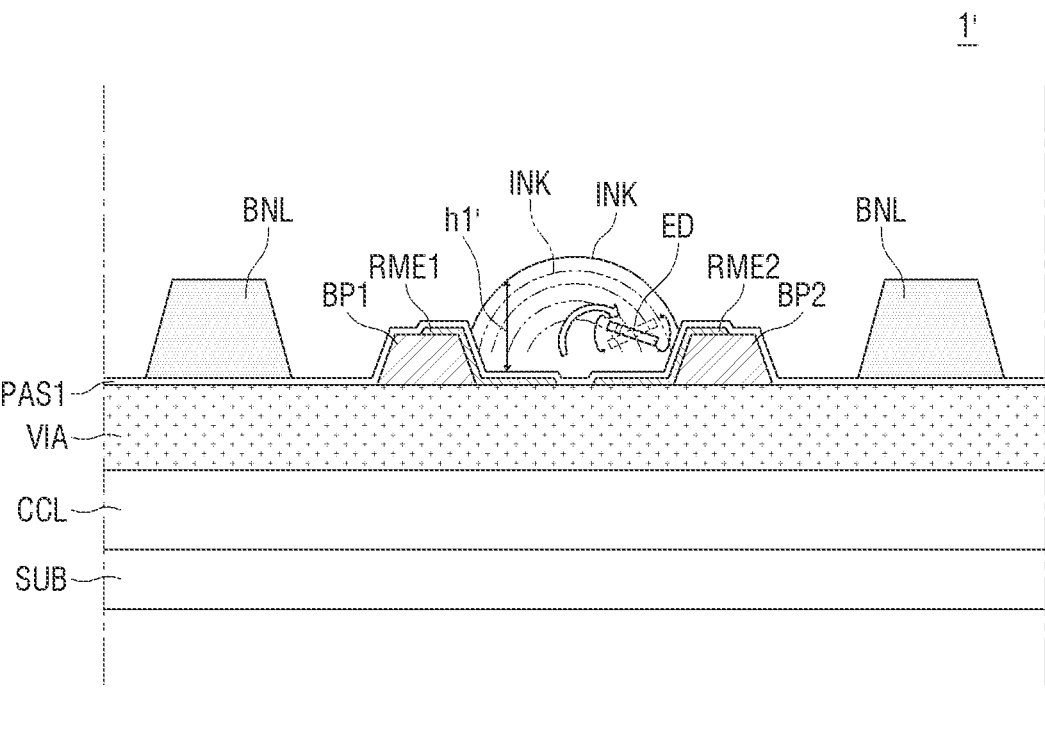
FIG. 11 is a cross-sectional view of a display device according to a comparative example.
Figure 11:
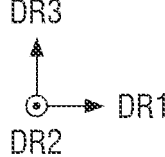

Thereafter, referring to FIG. 10, the light-emitting elements ED are placed between the first and second alignment electrodes RME1 and RME2 by removing the ink "INK". Thereafter, a second insulating layer PAS2 and connecting electrodes CNE are sequentially formed, thereby obtaining the display device 1 of FIG. 4.

Display devices according to other embodiments of the disclosure will hereinafter be described, focusing mainly on the differences with the display device 1. Like reference numerals indicate like elements throughout the present disclosure, and thus, detailed descriptions thereof will be omitted.

Figure 12:
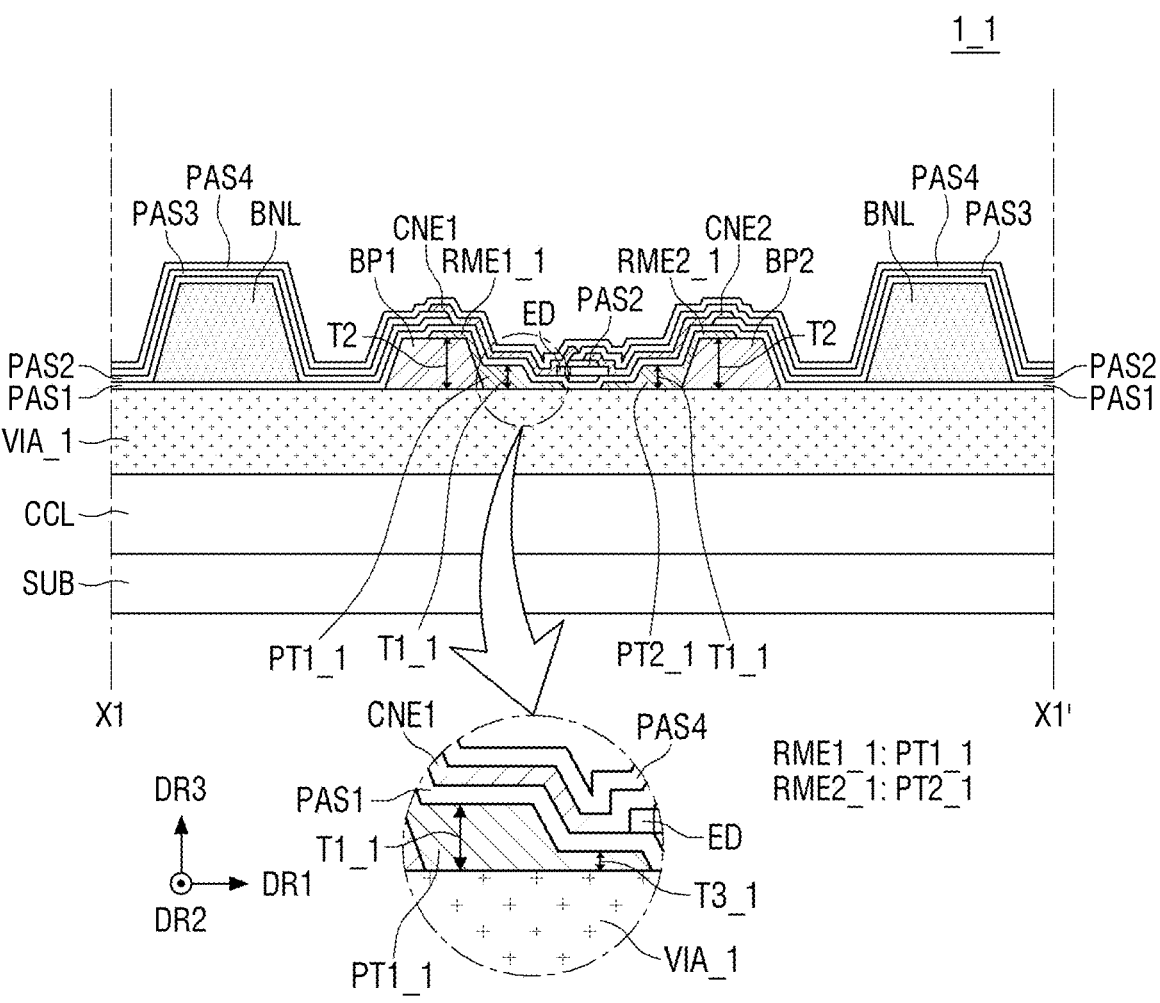
FIG. 12 is a cross-sectional view of a display device according to one or more embodiments of the present disclosure.
Figure 13:
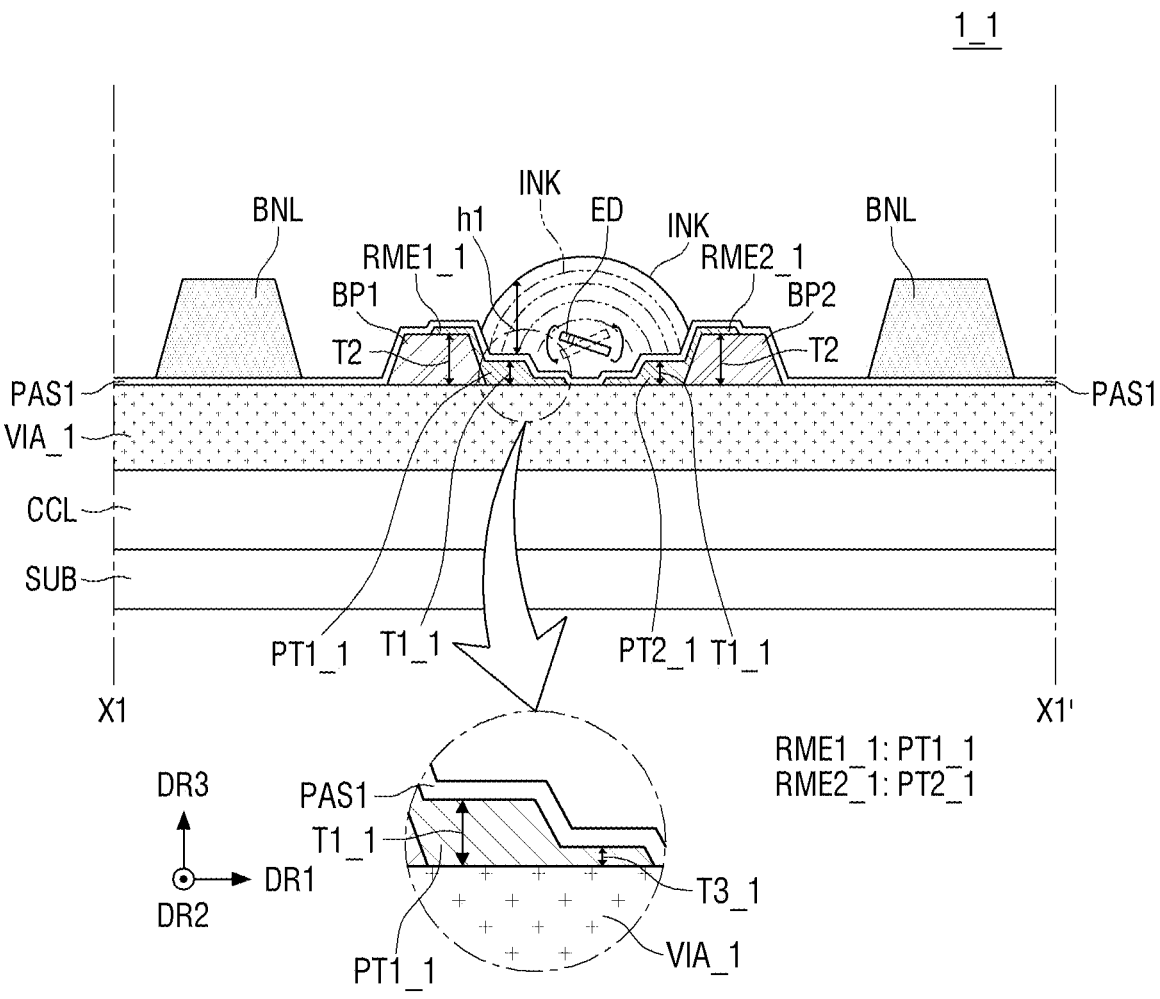
FIG. 13 is a cross-sectional view illustrating a method of manufacturing the display device of FIG. 12.

FIG. 12 is a cross-sectional view of a display device according to another embodiment of the present disclosure. FIG. 13 is a cross-sectional view illustrating a method of manufacturing the display device of FIG. 12.

Referring to FIGS. 12 and 13, in a display device 1_1, protrusions (PT1_1 and PT2_1) may be formed in alignment electrodes RME (RME1_1, RME2_1). In other words, the thickness of the alignment electrodes RME (RME1_1, RME2_1) may be relatively large in areas that are in direct contact with the top surface of a via insulating layer VIA_1, and may be relatively small in other areas.

The top surface of the via insulating layer VIA_1 may be flat. In other words, the via insulating layer VIA_1 may have substantially the same shape as its counterpart of FIG. 11 and may have a flat top surface without any protrusions protruding in the third direction DR3.

Each of the alignment electrodes RME (RME1_1, RME2_1) may include a protrusion and parts on both sides, in a first direction DR1, of the protrusion that protrude relatively thinly from the protrusion. In this case, the protrusions (PT1_1 and PT2_1) may include the same material as the alignment electrodes RME (RME1_1, RME2_1).

For example, both end portions, in the first direction DR1, of a first alignment electrode RME1_1 may have a relatively small thickness, i.e., a thickness T3_1, and a first protrusion PT1_1 of the first alignment electrode RME1_1 may have a relatively large thickness, i.e., a thickness T1_1. The thickness T1_1 of the first protrusion PT1_1 may be less than the thickness of a first inner bank BP1, i.e., a thickness T2.

Accordingly, a height difference may be formed between the top surfaces of the first inner bank BP1 and the first protrusion PT1_1.

Similarly, both end portions, in the first direction DR1, of a second alignment electrode RME2_1 may have a relatively small thickness, i.e., the thickness T3_1, and a second protrusion PT2_1 of the second alignment electrode RME2_1 may have a relatively large thickness, i.e., the thickness T1_1. The thickness T1_1 of the second protrusion PT2_1 may be less than the thickness of a second inner bank BP2, i.e., the thickness T2. Accordingly, a height difference may be formed between the top surfaces of the second inner bank BP2 and the second protrusion PT2_1.

As the edge thickness of ink "INK" ejected into the gap between the first and second inner banks BP1 and BP2 during the fabrication of the display device 1_1, i.e., a thickness h1 of the ink "INK" near the first or second inner bank BP1 or BP2, is less than in the comparative example of FIG. 11 due to the presence of the protrusions (PT1_1 and PT2_1), the tendency of light-emitting elements ED to move toward the edges of the ink "INK" can be reduced. As a result, the light-emitting elements ED can be prevented from being placed near the first or second inner bank BP1 or BP2 and can be properly guided into the gap between the first and second alignment electrodes RME1_1 and RME2_1. Thus, as the light-emitting elements ED can be in proper contact with connecting electrodes CNE (CNE1, CNE2), the lighting efficiency of each pixel PX can be improved.

Figure 14:
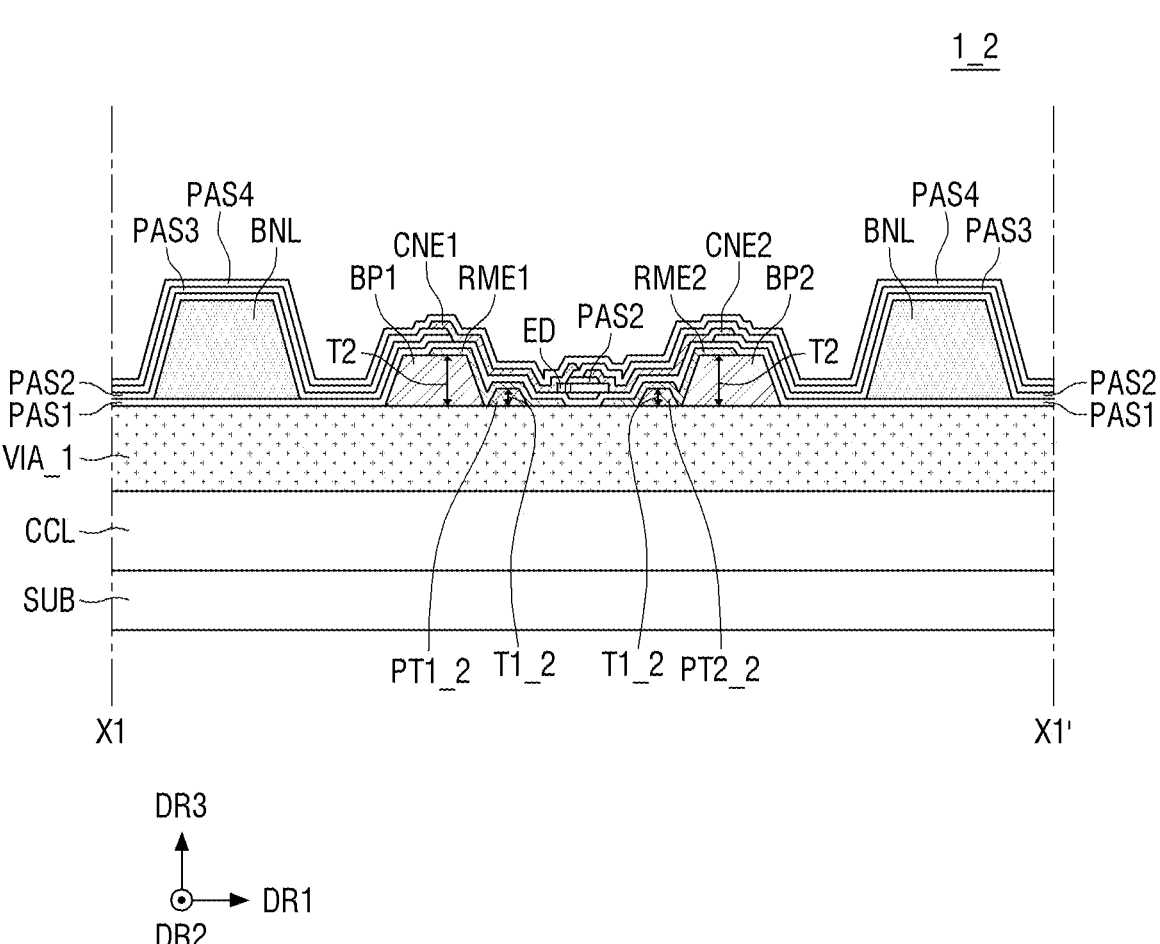
FIG. 14 is a cross-sectional view of a display device according to one or more embodiments of the present disclosure.
Figure 15:
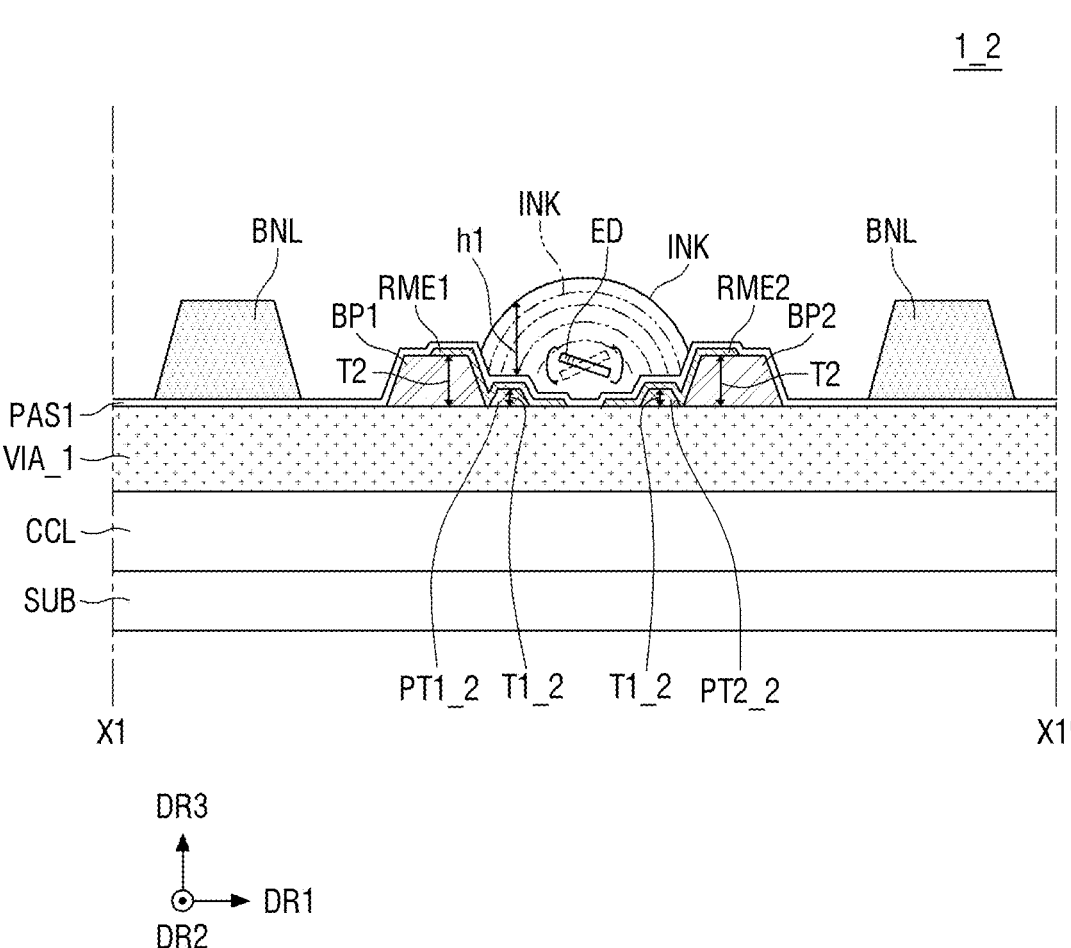
FIG. 15 is a cross-sectional view illustrating a method of manufacturing the display device of FIG. 14.

FIG. 14 is a cross-sectional view of a display device according to another embodiment of the present disclosure. FIG. 15 is a cross-sectional view illustrating a method of manufacturing the display device of FIG. 14.

Referring to FIGS. 14 and 15, in a display device 1_2, protrusions (PT1_2 and PT2_2) may be formed on a via insulating layer VIA_1 as separate layers. For example, the protrusions (PT1_2 and PT2_2) may be disposed on the top surface of the via insulating layer VIA_1 and may include a different material from the via insulating layer VIA_1. The via insulating layer VIA_1 is substantially the same as its counterpart of FIG. 12, and thus, a detailed description thereof will be omitted.

In one or more embodiments, the protrusions (PT1_2 and PT2_2) may include an inorganic insulating material, but the present disclosure is not limited thereto. Alternatively, the protrusions (PT1_2 and PT2_2) may include an organic insulating material.

In one or more embodiments, the protrusions (PT1_2 and PT2_2) may protrude from the top surface of the via insulating layer VIA_1 in a third direction DR3. The protrusions (PT1_2 and PT2_2) may include a first protrusion PT1_2, which is adjacent to a first inner bank BP1, and a second protrusion PT2_2, which is adjacent to a second inner bank BP2.

The thickness of the first protrusion PT1_2, i.e., a thickness T1_2, may be less than the thickness of the first inner bank BP1, i.e., a thickness T2. Accordingly, a height difference may be formed between the top surfaces of the first protrusion PT1_2 and the first inner bank BP1. Similarly, the thickness of the second protrusion PT2_2, i.e., the thickness T1_2, may be less than the thickness of the second inner bank BP2, i.e., the thickness T2. Accordingly, a height difference may be formed between the top surfaces of the second protrusion PT2_2 and the second inner bank BP2.

As the edge thickness of ink "INK" ejected into the gap between the first and second inner banks BP1 and BP2 during the fabrication of the display device 1_2, i.e., a thickness h1 of the ink "INK" near the first or second inner bank BP1 or BP2, is less than in the comparative example of FIG. 11 due to the presence of the protrusions (PT1_2 and PT2_2), the tendency of light-emitting elements ED to move toward the edges of the ink "INK" can be reduced. As a result, the light-emitting elements ED can be prevented from being placed near the first or second inner bank BP1 or BP2 and can be properly guided into the gap between first and second alignment electrodes RME1 and RME2. Thus, as the light-emitting elements ED can be in proper contact with connecting electrodes CNE (CNE1, CNE2), the lighting efficiency of each pixel PX can be improved.

Figure 16:
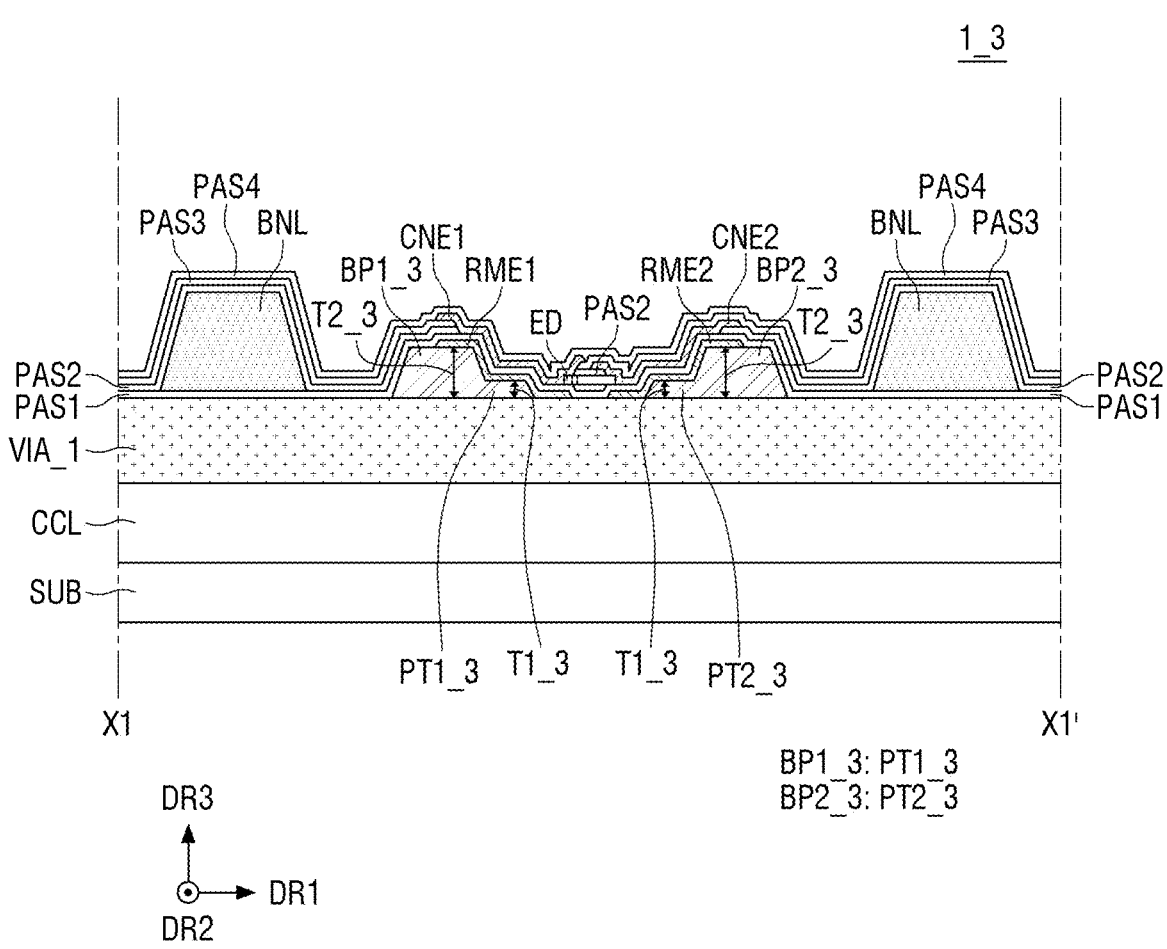
FIG. 16 is a cross-sectional view of a display device according to one or more embodiments of the present disclosure.
Figure 17:
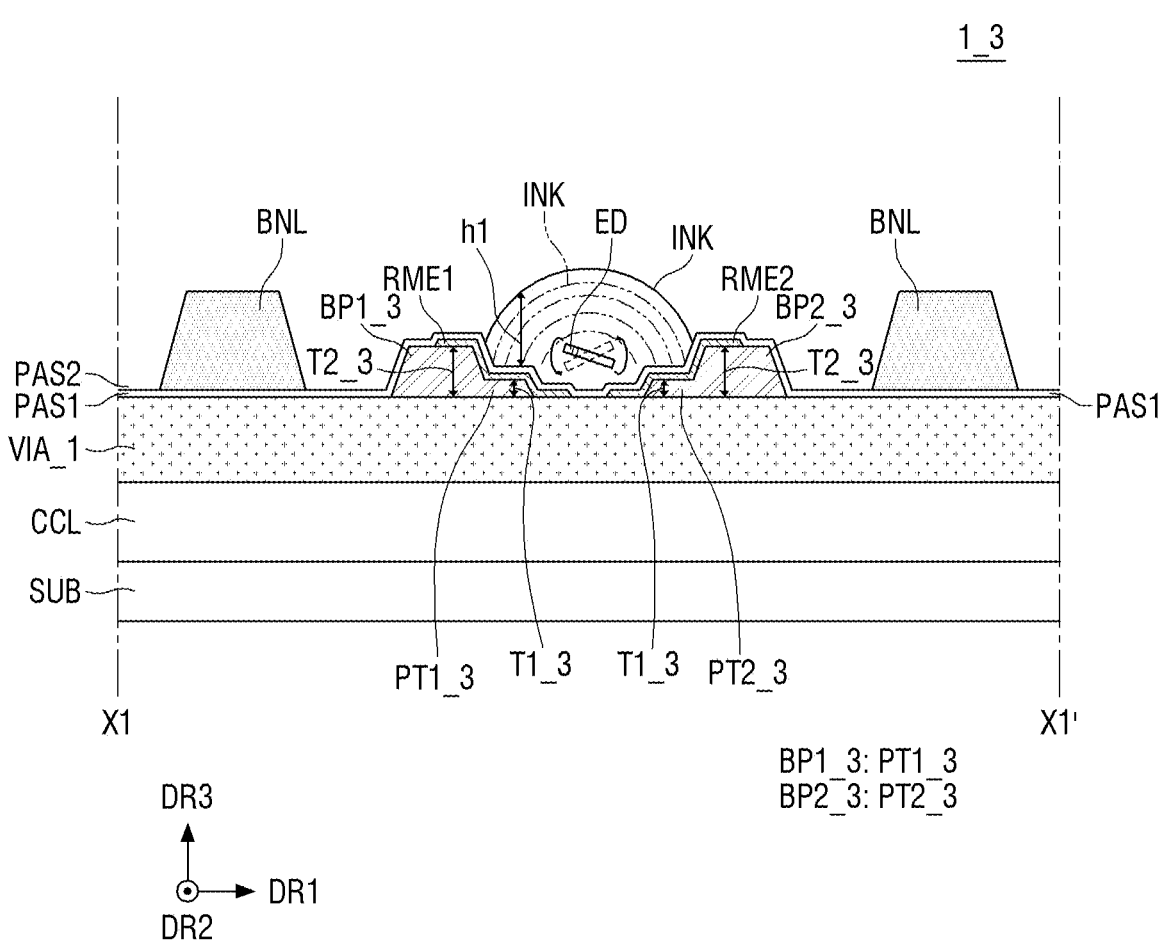
FIG. 17 is a cross-sectional view illustrating a method of manufacturing the display device of FIG. 16.

FIG. 16 is a cross-sectional view of a display device according to another embodiment of the present disclosure. FIG. 17 is a cross-sectional view illustrating a method of manufacturing the display device of FIG. 16.

Referring to FIGS. 16 and 17, in a display device 1_3, protrusions (PT1_3 and PT2_3) may be formed in inner banks (BP1_3 and BP2_3). The protrusions (PT1_3 and PT2_3) may be formed as parts of the inner banks (BP1_3 and BP2_3) to protrude from sides of the inner banks (BP1_3 and BP2_3). The protrusions (PT1_3 and PT2_3) may include the same material as the inner banks (BP1_3 and BP2_3). A via insulating layer VIA_1 is substantially the same as its counterpart of FIG. 12, and thus, a detailed description thereof will be omitted.

A first inner bank BP1_3 may include a first part having a relatively large thickness, i.e., a thickness T2_3, and a first protrusion PT1_3 having a relatively small thickness, i.e., a thickness T1_3. In this case, the first protrusion PT1_3 may be in direct contact with the top surface of the via insulating layer VIA_1, may protrude from a side of the first part in a direction toward a second inner bank BP2_3, and may be integrally formed with the first part. As the thickness of the first part of the first inner bank BP1_3, i.e., the thickness T2_3, is greater than the thickness of the first protrusion PT1_3, i.e., the thickness T1_3, a height difference may be formed between the top surfaces of the first part and the first protrusion PT1_3.

Similarly, the second inner bank BP2_3 may include a second part having a relatively large thickness, i.e., the thickness T2_3, and a second protrusion PT2_3 having a relatively small thickness, i.e., the thickness T1_3. In this case, the second protrusion PT2_3 may be in direct contact with the top surface of the via insulating layer VIA_1, may protrude from a side of the second part in a direction toward the first inner bank BP1_3, and may be integrally formed with the second part. As the thickness of the second part of the second inner bank BP2_3, i.e., the thickness T2_3, is greater than the thickness of the second protrusion PT2_3, i.e., the thickness T1_3, a height difference may be formed between the top surfaces of the second part and the second protrusion PT2_3.

As the edge thickness of ink "INK" ejected into the gap between the first and second inner banks BP1_3 and BP2_3 during the fabrication of the display device 1_3, i.e., a thickness h1 of the ink "INK" near the first or second inner bank BP1_3 and BP2_3, is less than in the comparative example of FIG. 11 due to the presence of the protrusions (PT1_3 and PT2_3), the tendency of light-emitting elements ED to move toward the edges of the ink "INK" can be reduced. As a result, the light-emitting elements ED can be prevented from being placed near the first or second inner bank BP1_3 or BP2_3 and can be properly guided into the gap between first and second alignment electrodes RME1 and RME2. Thus, as the light-emitting elements ED can be in proper contact with connecting electrodes CNE, the lighting efficiency of each pixel PX can be improved.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

What is claimed is:

1. A display device comprising:
   a substrate;
   a via insulating layer on the substrate;
   a first inner bank and a second inner bank on the via insulating layer and spaced from each other; and
   a first outer bank and a second outer bank, the first inner bank and the second inner bank being located between the first outer bank and the second outer bank, wherein:
   the via insulating layer comprises a protruding portion located in a gap between the first inner bank and the second inner bank and protruding from a top surface of the via insulating layer;
   a thickness of the protruding portion is less than a thickness of the first inner bank and a thickness of the second inner bank; and
   each of thicknesses of the first outer bank and the second outer bank is greater than the thickness of the first inner bank and the thickness of the second inner bank.

2. The display device of claim 1, wherein the protruding portion comprises a first protrusion adjacent to the first inner bank, and a second protrusion adjacent to the second inner bank.

3. The display device of claim 2, wherein:
   a thickness of the first protrusion is less than the thickness of the first inner bank; and
   a thickness of the second protrusion is less than the thickness of the second inner bank.

4. The display device of claim 3, wherein:
   a height difference is formed between top surfaces of the first inner bank and the first protrusion; and
   a height difference is formed between top surfaces of the second inner bank and the second protrusion.

5. The display device of claim 4, wherein the first protrusion and the second protrusion are spaced from each other.

6. The display device of claim 5, further comprising:
   light-emitting elements in a gap between the first protrusion and the second protrusion.

7. The display device of claim 6, further comprising:
   a first alignment electrode on the first protrusion; and
   a second alignment electrode on the second protrusion, wherein:
   the first alignment electrode and the second alignment electrode are spaced from each other; and
   the light-emitting elements are in a gap between the first alignment electrode and the second alignment electrode.

8. A display device comprising:
   a substrate;
   a first inner bank and a second inner bank on the substrate and spaced from each other;
   protrusions on the substrate, in a gap between the first inner bank and the second inner bank; and
   a first outer bank and a second outer bank, the first inner bank and the second inner bank being located between the first outer bank and the second outer bank, wherein the protrusions comprise a first protrusion adjacent to the first inner bank, and a second protrusion adjacent to the second inner bank;

a thickness of the first inner bank is greater than a thickness of the first protrusion;

a thickness of the second inner bank is greater than a thickness of the second protrusion; and each of thicknesses of the first outer bank and the second outer bank is greater than the thickness of the first inner bank and the thickness of the second inner bank.

9. The display device of claim 8, wherein the protrusions comprise an insulating material.

10. The display device of claim 9, wherein:

a height difference is formed between top surfaces of the first inner bank and the first protrusion, and a height difference is formed between top surfaces of the second inner bank and the second protrusion.

11. The display device of claim 10, wherein the first protrusion and the second protrusion are spaced from each other.

12. The display device of claim 11, further comprising:

light-emitting elements in a gap between the first protrusion and the second protrusion.

13. The display device of claim 8, wherein the protrusions comprise a conductive material.

14. The display device of claim 13, further comprising:

a first alignment electrode extending from both sides of the first protrusion and located on a top surface of the first inner bank and in the gap between the first and second inner banks; and a second alignment electrode extending from both sides of the second protrusion and located on a top surface of the second inner bank and in the gap between the first and second inner banks.

15. The display device of claim 14, wherein:

a height difference is formed between top surfaces of the first inner bank and the first protrusion; and a height difference is formed between top surfaces of the second inner bank and the second protrusion.

16. The display device of claim 15, wherein the first protrusion and the second protrusion are spaced from each other.

17. The display device of claim 16, further comprising:

light-emitting elements in a gap between the first and second protrusions.

* * * * *